(12) United States Patent
Richter et al.

(10) Patent No.: US 11,996,145 B2
(45) Date of Patent: May 28, 2024

(54) CROSS-POINT ARRAY WITH THRESHOLD SWITCHING SELECTOR MEMORY ELEMENT

(71) Applicant: Western Digital Technologies, Inc., San Jose, CA (US)

(72) Inventors: Hans Jurgen Richter, Palo Alto, CA (US); Michael K. Grobis, Campbell, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 177 days.

(21) Appl. No.: 17/735,277

(22) Filed: May 3, 2022

(65) Prior Publication Data
US 2023/0360700 A1 Nov. 9, 2023

(51) Int. Cl.
*G11C 13/00* (2006.01)

(52) U.S. Cl.
CPC .......... *G11C 13/003* (2013.01); *G11C 13/004* (2013.01); *G11C 13/0069* (2013.01); *G11C 2213/72* (2013.01)

(58) Field of Classification Search
CPC .................................................. G11C 13/0032
See application file for complete search history.

(56) References Cited

U.S. PATENT DOCUMENTS

| | | | |
|---|---|---|---|
| 7,414,883 B2 | 8/2008 | Gordon et al. | |
| 8,847,186 B2 | 9/2014 | Redaelli et al. | |
| 9,099,639 B2 | 8/2015 | Kim et al. | |
| 9,595,668 B2 * | 3/2017 | Govoreanu | ........ H10N 70/8833 |
| 10,424,374 B2 | 9/2019 | Redaelli et al. | |
| 10,490,738 B2 | 11/2019 | Govoreanu | |
| 10,727,405 B2 | 7/2020 | Varesi et al. | |
| 2006/0289848 A1 * | 12/2006 | Dennison | ............. H10N 70/882 257/3 |
| 2009/0207645 A1 * | 8/2009 | Parkinson | ........... G11C 13/0011 365/158 |

(Continued)

OTHER PUBLICATIONS

Noe, Pierre, et al., "Toward ultimate nonvolatile resistive memories: The mechanism behind ovonic threshold switching revealed," Science Advances, Research Article, Feb. 2020, 11 pages.

*Primary Examiner* — Douglas King
(74) *Attorney, Agent, or Firm* — Vierra Magen Marcus LLP

(57) ABSTRACT

Technology is disclosed for a memory system having a cross-point array with threshold switching selector memory cells. Each memory cell has a two-terminal threshold switching selector memory element that may be programmed to two different on-state conductances in order to store information. One bit value may be represented by a high-resistance state (HRS) when in the on-state and another bit value may be represented by a low-resistance state (LRS) when in the on-state. In one aspect, a conditioning signal is applied to the memory cell prior to programming. Applying a program signal with the opposite polarity as the conditioning signal may result in a higher conductance in the on-state than applying a program signal with the same polarity as the conditioning signal. The memory element may also serve as a selector for the memory cell. The memory element may include an Ovonic Threshold Switch (OTS).

20 Claims, 17 Drawing Sheets

(56) References Cited

U.S. PATENT DOCUMENTS

2020/0075676 A1    3/2020  Salahuddin et al.
2021/0035629 A1*  2/2021  Kim .................... G11C 11/54
2021/0143213 A1    5/2021  Hiblot et al.
2022/0157376 A1*  5/2022  Franklin ............. G11C 11/1659

* cited by examiner

CROSS-POINT ARRAY WITH THRESHOLD SWITCHING SELECTOR MEMORY ELEMENT

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

The memory cells may reside in a cross-point memory array. In a memory array with a cross-point type architecture, one set of conductive lines run across the surface of a substrate and another set of conductive lines are formed over the other set of conductive lines, running over the substrate in a direction perpendicular to the other set of conductive lines. The memory cells are located at the cross-point junctions of the two sets of conductive lines. One type of memory cell is a programmable resistance memory cell. A programmable resistance memory cell is formed from a material having a programmable resistance ("memory element"). In a binary approach, the programmable resistance memory cell at each cross-point can be programmed into one of two resistance states: high and low. In some approaches, more than two resistance states may be used.

In one technique, a memory cell in the cross-point memory array is selected for access by suitable biasing of the conductive lines that connect to that selected memory cell. Other memory cells are not selected for access ("non-selected memory cells") by suitable biasing of the conductive lines that connect to the unselected memory cells. Some biasing techniques may result in voltage across non-selected memory cells of the array, which can induce currents in non-selected memory cells. One approach to address this unwanted current leakage is to place a select transistor in series with the programmable resistance memory cell, such that the combination of the select transistor and programmable resistance element are connected between two conductive lines in the array. The select transistor can be considered to be part of the memory cell. Use of a select transistor, however, requires the introduction of additional control lines and cell area to be able to turn on the corresponding transistor of a selected memory cell.

An alternate approach to select transistors is the use of a two-terminal threshold switching selector in series with the programmable resistive element. A two-terminal threshold switching selector does not require the aforementioned additional control lines and cell area to be able to turn on the corresponding select transistor of a selected memory cell. A two-terminal threshold switching selector has a very high resistance in an off or non-conductive state until it is biased to a voltage higher than its threshold voltage (Vt), and until its voltage bias falls below Vhold ("Voffset") or current below a holding current Ihold. After the Vt is exceeded and while Vhold is exceeded across the threshold switching selector, the threshold switching selector has a much lower resistance (in an on or conductive state). In a different approach the selector element itself can serve both as a selector and as a programmable resistive element.

BRIEF DESCRIPTION OF THE DRAWINGS

Like-numbered elements refer to common components in the different figures.

DETAILED DESCRIPTION

Technology is disclosed herein for a memory system having a cross-point array with threshold switching selector (TSS) memory cells. In an embodiment, each TSS memory cell has a two-terminal threshold switching selector memory element that may be programmed to two different on-state conductances in order to store information. Alternatively, it may be stated that the threshold switching selector memory element may be programmed to two different on-state resistances in order to store information. For example, one bit value (e.g., 0) may be represented by a high-resistance state (HRS) when in the on-state and another bit value (e.g., 1) may be represented by a low-resistance state (LRS) when in the on-state. The memory element may also serve as a selector for the memory cell. The memory element is placed into the conductive state to select the memory cell. The memory element is placed into the non-conductive state to not select the memory cell. Thus, the memory element may be referred to as a self-selecting memory element. The threshold switching memory element may include, but is not limited to, an Ovonic Threshold Switch (OTS).

Figure 1:
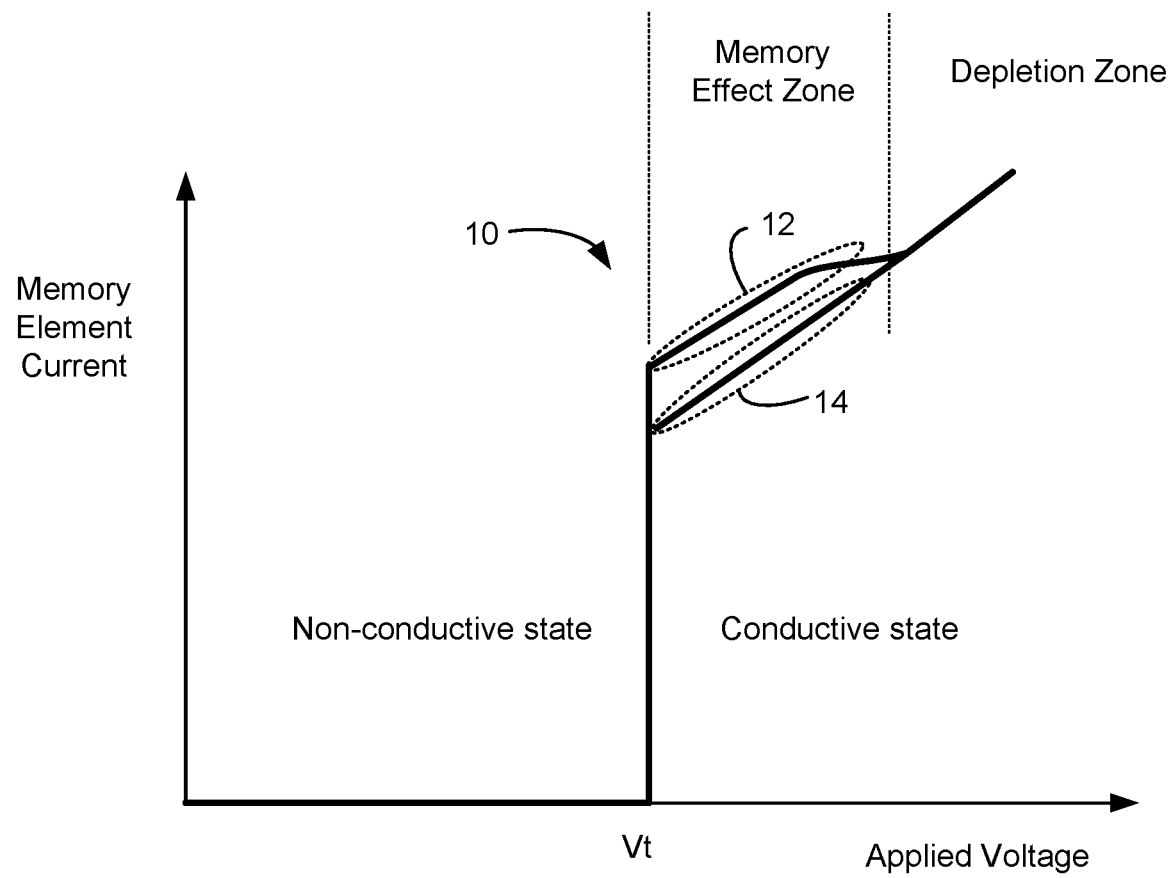
FIG. 1 is a plot of current versus time for an embodiment of a threshold switching selector (TSS) memory cell.

In one embodiment, programming the TSS memory cell takes advantage of a memory effect involving the resistance in the conductive state of the threshold switching memory element. FIG. 1 depicts a plot 10 of current versus voltage for an embodiment of a threshold switching memory element. The plot 10 depicts the current that flows through the threshold switching memory element for a given voltage applied across the threshold switching memory element. The threshold switching memory element has a very high resistance (in an off or non-conductive state) until it is biased to a voltage higher than its threshold voltage (Vt), and until its voltage bias falls below Vhold ("Voffset") or current below a holding current Ihold. After the Vt is exceeded and while Vhold is exceeded across the threshold switching memory element, the threshold switching memory element has a much lower resistance (in an on or conductive state). Therefore, the memory element may also serve as a selector for the memory cell. In the non-conductive state the current may be essentially 0A. The non-conductive state may also be referred to as an off state. When the applied voltage is above the Vt of the memory element, the memory element is in a conductive state. The conductive state may also be referred to as an on state. The magnitude of the current increases very rapidly at the Vt.

FIG. 1 also shows a memory effect zone and a depletion zone, which both correspond to the portion of the plot 10 in which the memory element is in the conductive state. The memory effect zone pertains to an effect in which the resistance of the memory element, when in the conductive state, depends on the relative polarities of two successive signals applied to the memory element. Plot 10 has a low resistance state (LRS) 12 and a high resistance state (HRS) 14, which both occur in the conductive state. The terms LRS and FIRS are defined relative to each other. That is, the on-state resistance of the memory element is lower when in the LRS than in the HRS. Stated another way, the on-state conductance of the memory element is higher when in the LRS than in the HRS. The resistance of the memory element in the HRS 14 (in the conductive state) is much lower than the resistance of the memory element when in the non-conductive state.

In an embodiment, the memory element is programmed in a manner that creates either the LRS 12 or the FIRS 14, assuming a pre-determined polarity of the read signal. In one embodiment, the memory element comprises a threshold switching material as may be used in an Ovonic Threshold Switch. In one embodiment, the memory element is read by applying a voltage ("read voltage") of a first polarity to the memory element during which the memory element is on. Therefore, the memory element enters a conductive state during the read signal. The read signal may be a voltage or a current. The conductance of the memory element when the read signal of the first polarity is applied depends on the previously applied programming signal to the memory element. In an embodiment, the memory element conductance is programmed by the choice of polarity that is applied by a programming signal relative to the polarity of the read signal. In an embodiment, to program the memory element to the LRS 12 a program voltage having a second (i.e., opposite) polarity to the first polarity (read polarity) may be applied to the memory element. On the other hand, to program the memory element to the HRS 14 a program voltage having the first (i.e., same) polarity (read polarity) is applied to the memory element. The read signal is sufficiently different from the programming signal to not significantly affect the on-state conductance of the memory cell during the read process. In an embodiment, a read signal has a sufficiently low magnitude and/or sufficiently short duration so at to not significantly affect the on-state conductance of the memory cell. Applying the program voltage with the opposite polarity as the read voltage may result in a higher conductance within the memory effect zone than applying a program voltage with the same polarity as the read voltage. For the sake of discussion, this higher conductance within the memory effect zone (LRS 12) will be referred to herein as "excess conductance." This excess conductance does not exist (or exists to a much smaller extent) in the depletion zone. In an embodiment, the depletion zone is a result of the voltage applied to the memory being much higher than the Vt of the memory element.

In one embodiment, a programming signal having a first polarity will leave the memory element in a physical state such that if the memory cell is later read with a read signal having the first polarity an FIRS will be detected. However, the physical state in the memory element may be such that if the memory cell is later read with a read signal having a second polarity (opposite the first) an LRS will be detected. In an embodiment, the definition of the LRS and the HRS are defined based on the polarity of the read signal. The polarity of the programming signal is used to create the LRS or the HRS, given the polarity of the read signal. Thus, by convention used herein it will be understood that the terms LRS and HRS are defined based on the polarity of the read signal. Thus, a phrase such as "programming a memory element to the LRS" will be understood to mean that the memory element will be read as having the LRS when read with the read signal having the pre-defined read polarity. A phrase such as "programming a memory element to the FIRS" will be understood to mean that the memory element will be read as having the HRS when read with the read signal having the pre-defined read polarity. Moreover, the term "read on-state" is defined based on the polarity of the read signal. That is, the "read on-state" is defined herein as the on-state that occurs from turning the memory element on with a read signal having the pre-defined polarity of the read signal. The term, "read on-state conductance", as defined herein, is the conductance of the memory cell when turned on by a read signal having the pre-defined read polarity.

TABLE I

|  | "1" Write First Polarity | "0" Write Second Polarity |
| --- | --- | --- |
| Read First Polarity | HRS | LRS |
| Read Second Polarity | LRS | HRS |

Table I summarizes one embodiment of the polarity of signals that may be used to program a TSS memory cell to either a "1" or a "0" and read the TSS memory cell. Table I shows that to program a "1" the write has a first polarity and to program a "0" the write has a second polarity. The first polarity could be referred to as positive and the second polarity could be referred to as negative. Alternatively, the first polarity could be referred to as negative and the second polarity could be referred to as positive. In some embodiments, the assignment of which polarity is negative and which polarity is positive is arbitrary. In an embodiment, the TSS memory cell can be read with either the first polarity or the second polarity. Table I shows that if the read signal has the first polarity then the HRS will indicate a "1" and the LRS will indicate a "0". However, if the read signal has the second polarity then the HRS will indicate a "0" and the LRS will indicate a "1". In some cases, the difference between the LRS and the HRS may be greater when reading in one or the other polarity. In other words, reading in one of the polarities may provide a better read margin than the other. In an embodiment, the polarity having the better read margin is typically used for read. It is not required that the memory cell be capable of being accurately read with both the first polarity and the second polarity. As long as reading with one of the polarities provides a sufficient read margin between the LRS and HRS it is not required that there even be distinct LRS and HRS when reading with the other polarity.

In some embodiments, the memory element is written and read using a voltage-force approach in which a voltage is forced across the memory cell that contains the memory element (hence the voltage will be forced across the memory element). In some embodiments, the memory element is written and read using a current-force approach in which one terminal of the memory cell is held at a select voltage while a current is forced into a select line connected to the other terminal of the memory cell that contains the memory element. With either the voltage-force or current-force approach, the memory element may be programmed to either the LRS 12 or the HRS 14. Likewise, either the voltage-force or current-force approach may be used to place the memory element into the conductive state and determine whether the memory element is in the LRS 12 or the HRS 14.

In an embodiment, the memory element is read by applying a signal (voltage or current) to place the memory element in the conductive state and determining whether the memory element is in the LRS 12 or HRS 14. In one embodiment, a self-referenced read (SRR) is used to determine whether a memory element is in the LRS 12 or HRS 14. In general, a SRR has a first read (Read1), a write to a known state (e.g., HRS), and a second read (Read2). The sense voltage from Read2 may server as a "self-reference", which is compared to a sense voltage from Read1. In one embodiment, a "referenced read" is used to determine whether a memory element is in the LRS 12 or HRS 14. In an embodiment of a reference read, only one read signal is applied to the memory element. A sense voltage from this read is compared to a global reference voltage to determine whether the memory element is in the LRS 12 or FIRS 14.

The threshold switching memory element may also serve as a selector. The Vt of threshold switching selectors including, but not limited to Ovonic Threshold Switches, may drift over time. For example, the Vt may increase over time. However, in an embodiment, the bit values are represented by the read on-state resistance of the selector; therefore, any Vt drift of the selector will not impact the reading of the threshold switching memory element.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application.

Figure 2A:
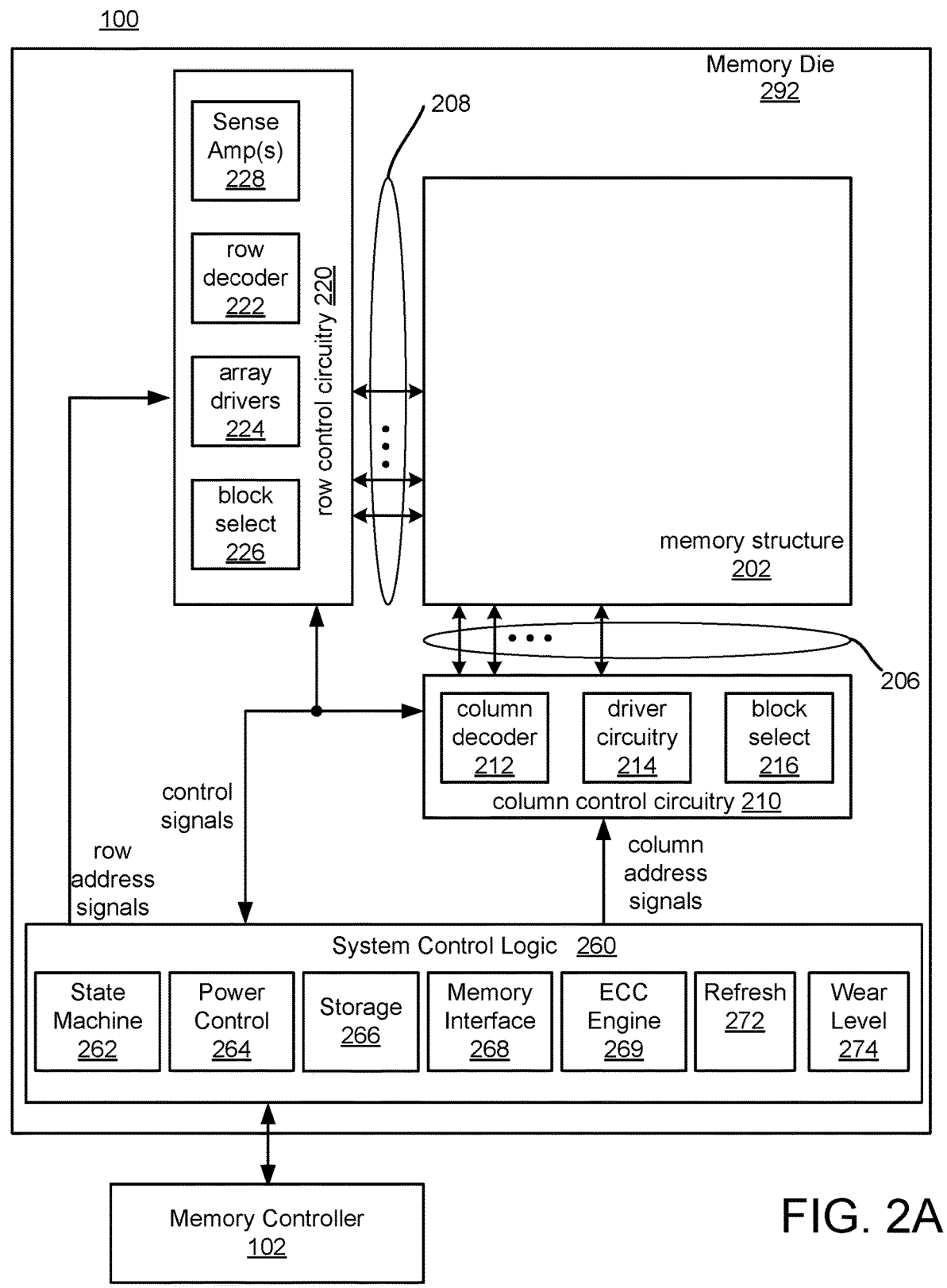
FIG. 2A is a block diagram that depicts one embodiment of a memory system that can implement the technology described herein.

FIG. 2A is a block diagram that depicts one embodiment of a memory system 100 that can implement the technology described herein. The memory system 100 has a memory controller 102 and a memory die 292. Only one memory die 292 is depicted in FIG. 2A, but the memory controller 102 may control a number of memory dies 292. Memory die 292 includes a memory structure 202 that can include any of memory cells described in the following. The array terminal lines of memory structure 202 include the various layer(s) of word lines organized as rows, and the various layer(s) of bit lines organized as columns. However, other orientations can also be implemented. Memory die 292 includes row control circuitry 220, whose outputs 208 are connected to respective word lines of the memory structure 202. Row control circuitry 220 receives a group of M row address signals and one or more various control signals from System Control Logic circuit 260, and typically may include such circuits as row decoders 222, row drivers 224, and block select circuitry 226 for both reading and writing operations. Row control circuitry 220 may also include read/write circuitry. In an embodiment, row decode and control circuitry 220 has sense amplifiers 228, which each contain circuitry for sensing a condition (e.g., voltage) of a word line of the memory structure 202. In an embodiment, by sensing a word line voltage, a condition of a memory cell in a cross-point array is determined. Memory die 292 also includes column decode and control circuitry 210 whose input/outputs 206 are connected to respective bit lines of the memory structure 202. Although only single block is shown for structure 202, a memory die can include multiple arrays or "tiles" that can be individually accessed. Column control circuitry 210 receives a group of N column address signals and one or more various control signals from System Control Logic 260, and typically may include such circuits as column decoders 212, column decoders and drivers 214, block select circuitry 216, as well as read/write circuitry, and I/O multiplexers.

System control logic 260 receives data and commands from a memory controller 102 and provides output data and status to the memory controller 102. The memory controller 102 may implement an interface such as DDR, DIMM, CXL, PCIe and others. The memory controller 102 may interface with a host system, or may be embedded in a host system. In one embodiment, the memory controller 102 is embedded on the memory die 292. In such case, data and commands may be sent and received directly between memory die 292 and host system. In some embodiments, the system control logic 260 can include a state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor. The system control logic 260 can also include a power control module 264 that controls the power, current source currents, and voltages supplied to the rows and columns of the memory 202 during memory operations and may include charge pumps and regulator circuit for creating regulating voltages, and on/off control of each for word line bit line selection of the memory cells. System control logic 260 includes storage 266, which may be used to store parameters for operating the memory structure 202. System control logic 260 also includes refresh logic 272 and wear leveling logic 274. Optionally all or a portion of the refresh logic 272 may reside on the memory controller 102.

Commands and data are transferred between the memory controller 102 and the memory die 292 via memory controller interface 268 (also referred to as a "communication interface"). Such interface may be PCIe, CXL, DDRn for example. Memory controller interface 268 is an electrical interface for communicating with memory controller 102. In one embodiment, memory controller interface 268 includes a set of input and/or output (I/O) pins that connect to the controller 102. In various embodiments, the interface 268 is JEDEC standard DDRn or LPDDRn, such as DDR5 or LPDDR5, or a subset thereof with smaller page and/or relaxed timing. Other I/O interfaces can also be used. For example, memory controller interface 268 may implement a Toggle Mode Interface.

System control logic 260 on the memory die may include Error Correction Code (ECC) engine 269. ECC engine 269 may be referred to as an on-die ECC engine, as it is on the same semiconductor die as the memory cells. That is, the on-die ECC engine 269 may be used to encode data that is to be stored in the memory structure 202, and to decode the decoded data and correct errors. The encoded data may be referred to herein as a codeword or as an ECC codeword. The ECC codeword may contain data bits and parity bits. ECC engine 269 may be used to perform a decoding algorithm and to perform error correction. Hence, the ECC engine 269 may decode the ECC codeword. In an embodiment, the ECC engine 269 is able to decode the data more rapidly by direct decoding without iteration.

Having the ECC engine 269 on the same die as the memory cells allows for fast decoding. The ECC engine 269 can use a wide variety of decoding algorithms including, but not limited to, Reed Solomon, a Bose-Chaudhuri-Hocquenghem (BCH), and low-density parity check (LDPC). In an embodiment, the ECC engine 269 is able to determine or estimate a number of bit errors in a codeword prior to decoding the codeword. In an embodiment, the ECC engine 269 calculates the syndrome of the codeword in order to estimate the number of bit errors in the codeword. In an embodiment, the ECC engine 269 is capable of decoding a codeword provided that there are no more than a certain number of bits in error in the codeword.

In some embodiments, all of the elements of memory die 292, including the system control logic 260, can be formed as part of a single die. In other embodiments, some or all of the system control logic 260 can be formed on a different die. In some embodiments, some or all of the system control logic 260 can reside on an external controller that is located on a separate circuit board from the memory die 292.

In one embodiment, memory structure 202 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon (or other type of) substrate. In another embodiment, memory structure 202 comprises a two-dimensional memory array of non-volatile memory cells. The exact type of memory array architecture or memory cell included in memory structure 202 is not limited to the examples above. Many different types of memory array architectures or memory technologies can be used to form memory structure 326. No particular non-volatile memory technology is required for purposes of the new claimed embodiments proposed herein.

In some embodiments, the memory structure 202 has one or more cross-point arrays. In a cross-point architecture, a first set of conductive lines or wires, such as word lines, run in a first direction relative to the underlying substrate and a second set of conductive lines or wires, such a bit lines, run in a second direction relative to the underlying substrate. The memory cells are sited at the intersection of the word lines and bit lines. The memory cells at these cross-points can be formed according to any of a number of technologies. The following discussion will mainly focus on embodiments based on a cross-point architecture using two-terminal threshold switching memory cells. In an embodiment, the two-terminal threshold switching memory cells includes an Ovonic Threshold Switch (OTS) to comprise a selectable memory bit.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts, the memory structure 202 and the peripheral circuitry, including all of the other elements. An important characteristic of a memory circuit is its capacity, which can be increased by increasing the area of the memory die 292 that is given over to the memory structure 202; however, this reduces the area of the memory die available for the peripheral circuitry or increases cost which is related to chip area. This can place quite severe restrictions on these peripheral elements. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die 292 is the amount of area to devote to the memory structure 202 and the amount of area to devote to the peripheral circuitry. Such tradeoffs may result in more IR drop from use of larger x-y arrays of memory between driving circuits on the word line and bit line, which in turn may be benefit more from use of voltage limit and zoning of the voltage compliance by memory cell position along the word line and bit line.

Another area in which the memory structure 202 and the peripheral circuitry are often at odds is in the processing involved in forming these regions, since these regions often involve differing processing technologies and the trade-off in having differing technologies on a single die. For example, elements such as sense amplifier circuits, charge pumps, logic elements in a state machine, and other peripheral circuitry in system control logic 260 often employ PMOS devices. In some cases, the memory structure will be based on CMOS devices. Processing operations for manufacturing a CMOS die will differ in many aspects from the processing operations optimized for NMOS-only technologies.

Figure 2B:
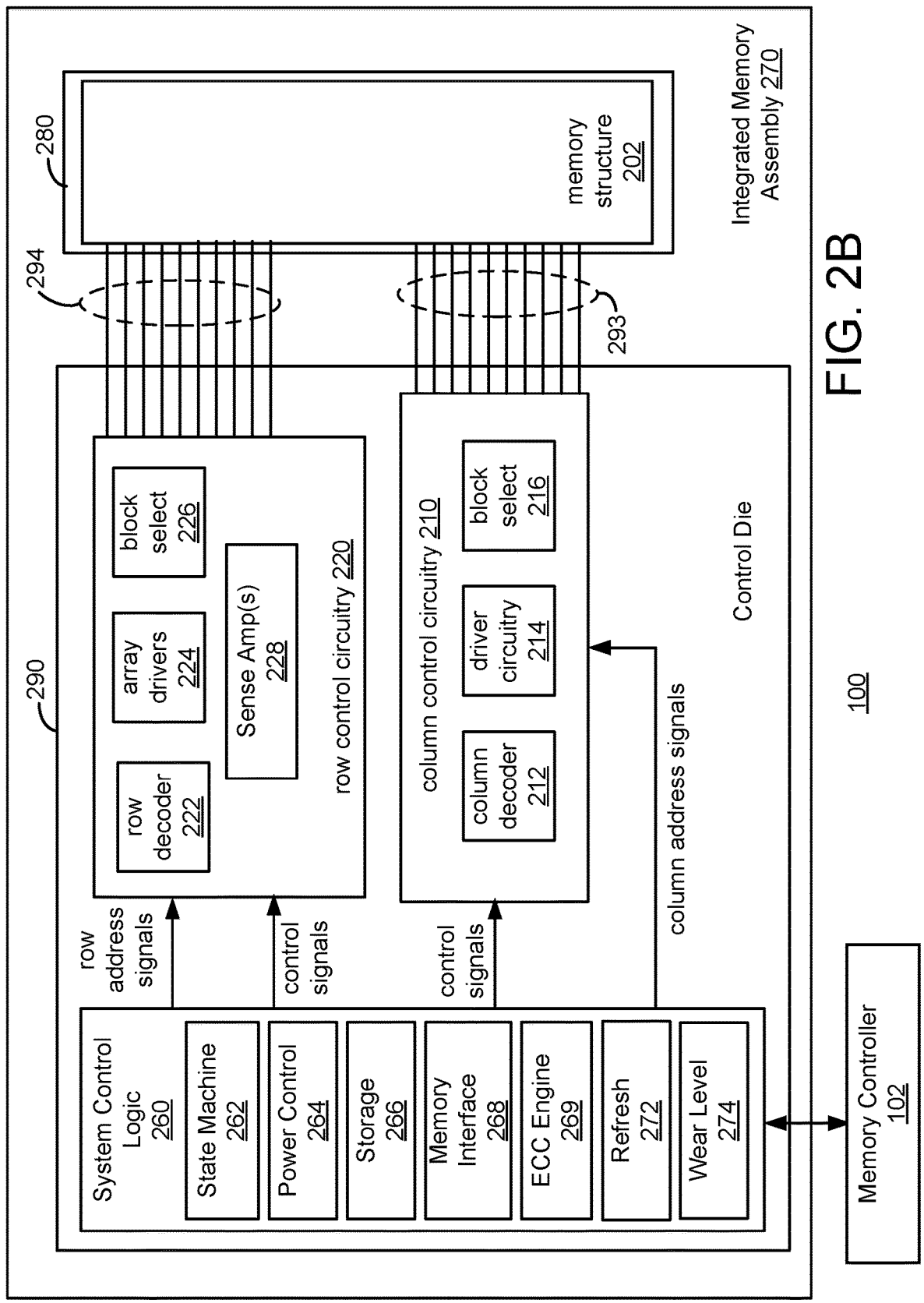
FIG. 2B is a block diagram that depicts one embodiment of a memory system that can implement the technology described herein.

To improve upon these limitations, embodiments described below can separate the elements of FIG. 2A onto separately formed die that are then bonded together. FIG. 2B depicts a memory system 100 having an integrated memory assembly 270 and a memory controller 102. The integrated memory assembly 270 has a memory structure die 280 and a control die 290. The integrated memory assembly 270 is in communication with the memory controller 102. The memory structure 202 is formed on the memory structure die 280 and some or all of the peripheral circuitry elements, including one or more control circuits, are formed on the control die 290. For example, a memory structure die 280 can be formed of just the memory elements, such as a cross-point array having two-terminal threshold switching memory cells, or other memory type. Some or all of the peripheral circuitry, even including elements such as decoders and sense amplifiers, can then be moved on to the control die. This allows each of the semiconductor die to be optimized individually according to its technology. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional die, such as two memory die and one control die, for example.

As with 202 of FIG. 2A, the memory structure die 280 in FIG. 2B can include multiple independently accessible arrays or "tiles." System control logic 260, row control circuitry 220, and column control circuitry 210 are located in control die 290. In some embodiments, all or a portion of the column control circuitry 210 and all or a portion of the row control circuitry 220 are located on the memory structure die 280. In some embodiments, some of the circuitry in the system control logic 260 is located on the on the memory structure die 280.

FIG. 2B shows column control circuitry 210 on the control die 290 coupled to memory structure 202 on the memory structure die 280 through electrical paths 293. For example, electrical paths 293 may provide electrical connection between column decoder 212, column driver circuitry 214, and block select 216 and bit lines of memory structure 202. Electrical paths may extend from column control circuitry 210 in control die 290 through pads on control die 290 that are bonded to corresponding pads of the memory structure die 280, which are connected to bit lines of memory structure 202. Each bit line of memory structure 202 may have a corresponding electrical path in electrical paths 293, including a pair of bond pads, which connects to column control circuitry 210. Similarly, row control circuitry 220, including row decoder 222, row drivers 224, block select 226, and sense amplifiers 228 are coupled to memory structure 202 through electrical paths 294. Each of electrical path 294 may correspond to, for example, a word line. Additional electrical paths may also be provided between control die 290 and memory structure die 280.

Figure 3:
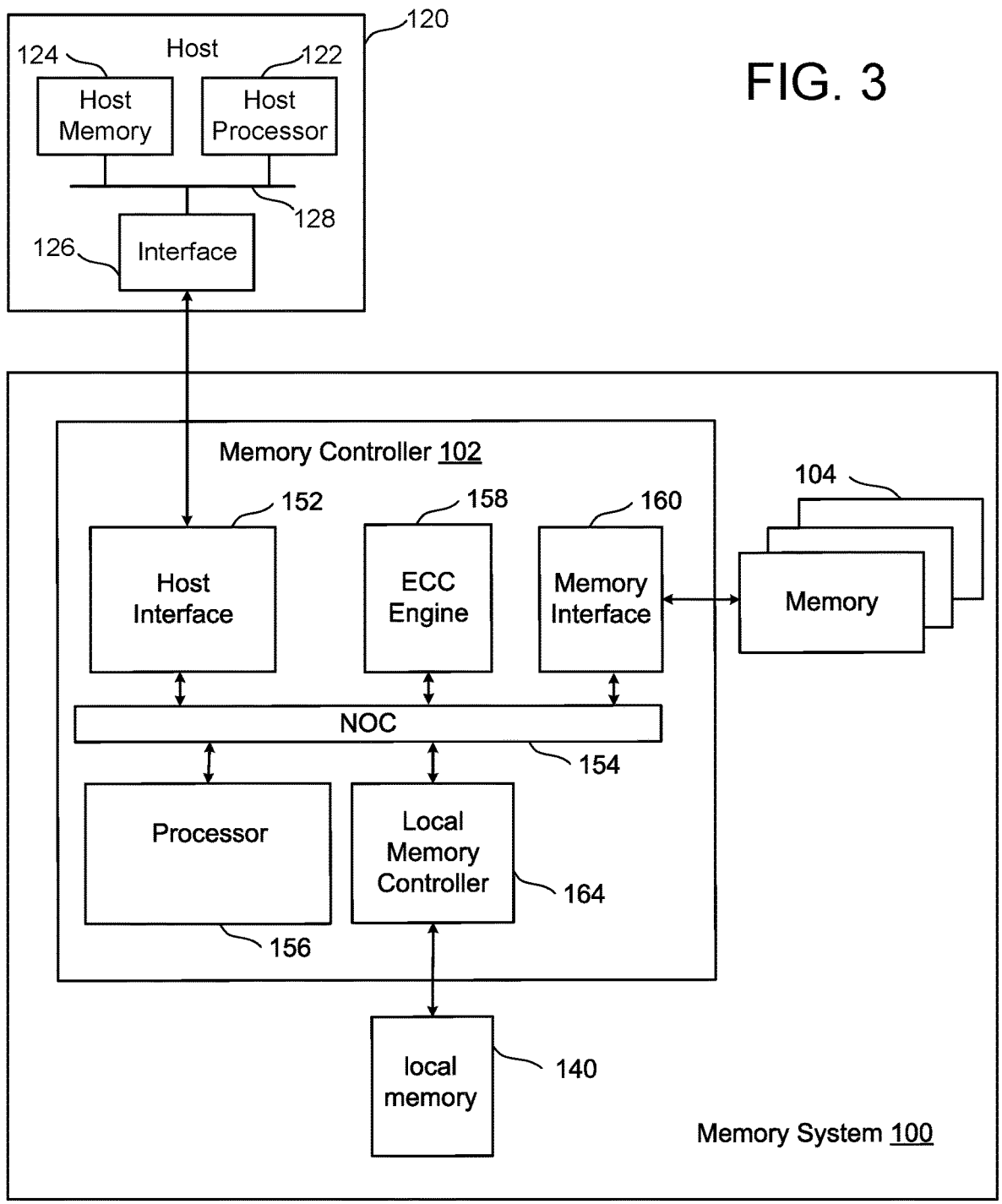
FIG. 3 is a block diagram of one embodiment of a memory system connected to a host.

In the following discussion, the memory structure 202 of FIGS. 2A and 2B will be discussed in the context of a cross-point architecture. Technology for a cross-point memory array having two-terminal threshold switching memory cells can be used in many different types of memory and memory systems. FIG. 3 is a block diagram of one embodiment of a memory system (or more briefly "memory system") 100 connected to a host system 120. Memory system 100 of FIG. 3, as well as host 120, can implement the technology presented herein for refresh in a cross-point array. The memory die 292 and/or the control die 290 may be used in any of local memory 140, memory 104 and/or host memory 124. In an embodiment, the memory cells have a two-terminal threshold switching memory cell (e.g., OTS element). Many different types of memory systems can be used with the technology proposed herein. Example memory systems include dual in-line memory modules (DIMMs), solid state drives ("SSDs"), memory cards and embedded memory devices; however, other types of memory systems can also be used.

Memory system 100 of FIG. 3 comprises a memory controller 102, memory 104 for storing data, and local memory 140. In an embodiment, local memory 140 includes one or more cross-point arrays having two-terminal threshold switching memory cells. However, local memory can include another type of memory such as MRAM, ReRAM, or DRAM. The local memory 140 may be non-volatile and retain data after power off. Alternatively, local memory 140 may be volatile or non-volatile and not be expected to retain data after power off by reloading it from data after power-up. In some embodiments, local memory 140 is DRAM or a DRAM replacement. In one embodiment, memory controller 102 and/or local memory controller 164 provides access to programmable resistance memory cells in a cross-point array in local memory 140. For example, memory controller 102 may provide for access in a cross-point array of two-terminal threshold switching memory cells in local memory 140. In another embodiment the memory controller 102 or interface 126 or both are eliminated and the memory packages 104 are connected directly to the host 120 through a bus such as DDRn. Or they are connected to a Host memory management unit (MMU). In another instance, the memory controller 102 or portions are moved onto the Memory 104 for direct connection of the Memory 104 to the Host, such as by providing parity bits, ECC, and wear level on the Memory along with an DDRn interface to/from the Host or MMU. The term memory system, as used throughout this document, is not limited to memory system 100. For example, the local memory 140 or the combination of local memory 140 and memory controller 164 could be considered to be a memory system. Likewise, host memory 124 or the combination of host processor 122 and host memory 124 considered to be a memory system.

The components of memory system 100 depicted in FIG. 3 are electrical circuits. The memory controller 102 has host interface 152, processor 156, ECC engine 158, memory interface 160, and local memory controller 164. The host interface 152 is connected to and in communication with host 120. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140. In other embodiments, local high speed memory 140 can be DRAM, SRAM or another type of volatile memory.

ECC engine 158 performs error correction services. For example, ECC engine 158 performs data encoding and decoding for error correction of the data fetched from memory 140 or 104. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156. In one embodiment, local memory 140 has an ECC engine with or without a wear level engine. In one embodiment, memory 104 has an ECC engine with or without a wear level engine.

Processor 156 performs the various controller memory operations, such as programming, erasing, reading, and memory management processes including wear level. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 102 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory 104 and a subset of the L2P tables are cached (L2P cache) in the local high speed memory 140.

Memory interface 160 communicates with memory 104. In an embodiment, memory 104 contains programmable resistance memory cells in a cross-point array. Each programmable resistance memory cell has a two-terminal threshold switching memory cell. The two-terminal threshold switching memory cell may be a self-selecting memory cell. In one embodiment, memory interface provides a Toggle Mode interface. Other interfaces can also be used. In some example implementations, memory interface 160 (or another portion of controller 102) implements a scheduler and buffer for transmitting data to and receiving data from one or more memory die.

In one embodiment, memory 104 voltage-force comprises a plurality of memory packages. Each memory package includes one or more memory die. Therefore, memory controller 102 is connected to one or more memory die. In one embodiment, the memory package can include types of memory, such as storage class memory (SCM) based on programmable resistance random access memory (such as ReRAM, MRAM, FeRAM or RRAM) or a phase change memory (PCM). In one embodiment, memory controller 102 provides access to memory cells in a cross-point array in a memory package 104. The cross-point array, in one embodiment, has two-terminal threshold switching memory cells (e.g., OTS memory cells), as described herein.

Memory controller 102 communicates with host system 120 via an interface 152 that implements a protocol such as, for example, Compute Express Link (CXL). Or such controller can be eliminated and the memory packages can be placed directly on the host bus, DDRn for example. For working with memory system 100, host system 120 includes a host processor 122, host memory 124, and interface 126 connected along bus 128. Host memory 124 is the host's physical memory, and can be DRAM, SRAM, ReRAM, MRAM, non-volatile memory, or another type of storage. In an embodiment, host memory 124 contains a cross-point array of programmable resistance memory cells, with each memory cell comprising a two-terminal threshold switching element that serves as the programmable resistance memory element, as described herein.

Host system 120 is external to and separate from memory system 100. In one embodiment, memory system 100 is embedded in host system 120. Host memory 124 may be referred to herein as a memory system. The combination of the host processor 122 and host memory 124 may be referred to herein as a memory system.

For purposes of this document, the phrase "a control circuit" can include one or more of memory controller 102, system control logic 260, column control circuitry 210, row control circuitry 220, a micro-controller, a state machine, host processor 122, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver.

For purposes of this document, the term "apparatus" can include, but is not limited to, one or more of host system 120, the combination of host processor 122 and host memory 124, host memory 124, memory system 100, memory controller 102, local memory 140, the combination of local memory controller 164 and/or memory controller 102 and local memory 140, memory package 104, memory die 292, integrated memory assembly 270, and/or control die 290.

Figure 4A:
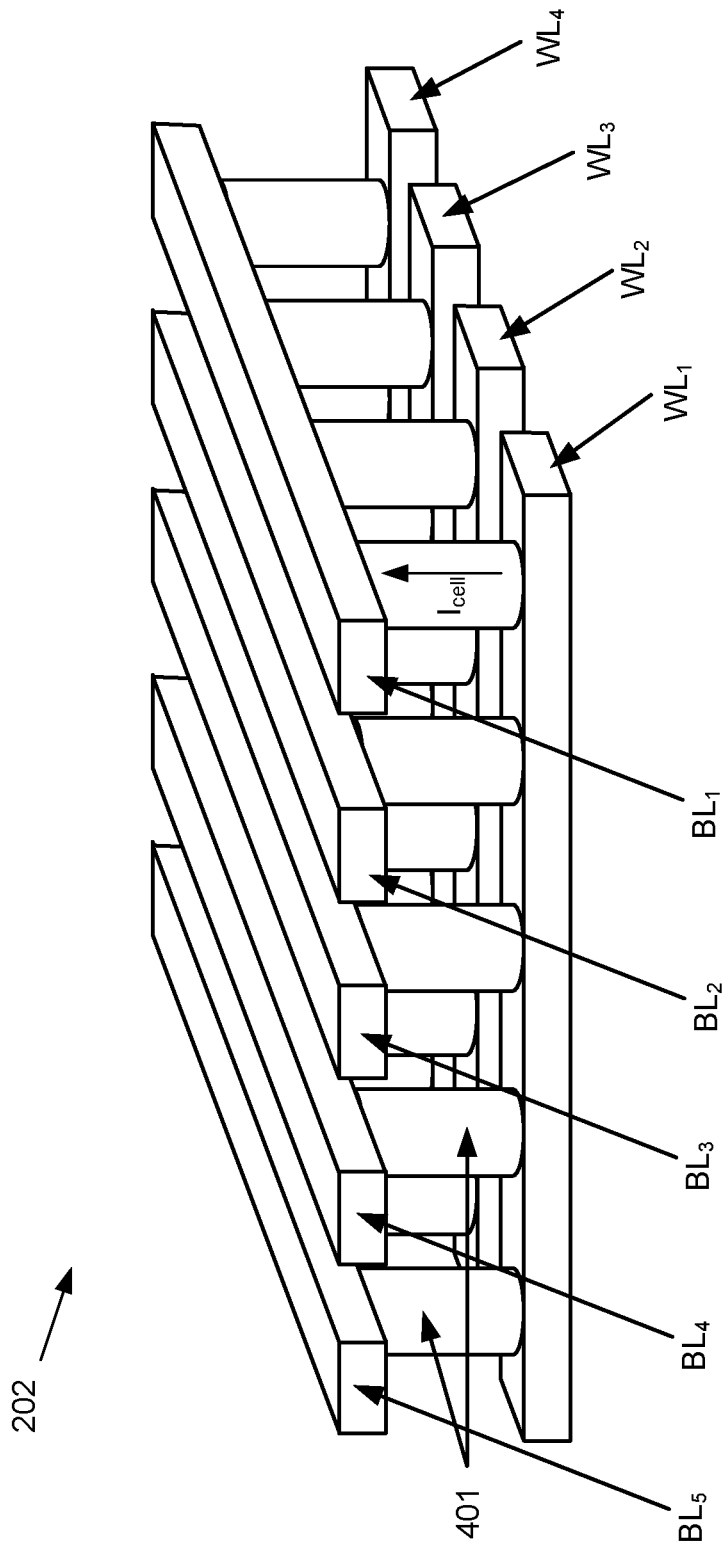
FIG. 4A depicts one embodiment of a portion of a memory array that forms a cross-point architecture in an oblique view.

FIG. 4A depicts one embodiment of a portion of a memory array that forms a cross-point architecture in an oblique view. Memory structure 202 of FIG. 4A is one example of an implementation for memory structure 202 in FIG. 2A or 2B, where a memory die 292 or memory structure die 280 can include multiple such array structures. The memory structure 202 may be included in local memory 140 or host memory 124. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 4A is an example of a horizontal cross-point structure in which word lines $WL_1$-$WL_5$ and $BL_1$-$BL_5$ both run in a horizontal direction relative to the substrate, while the memory cells, two of which are indicated at 401, are oriented so that the current through a memory cell (such as shown at $I_{cell}$) runs in the vertical direction. In a memory array with additional layers of memory cells, such as discussed below with respect to FIG. 4D, there would be corresponding additional layers of bit lines and word lines.

As depicted in FIG. 4A, memory structure 202 includes a plurality of memory cells 401. The memory cells 401 may include re-writeable memory elements, such as can be implemented using a two-terminal threshold switching selector memory element. The memory element may serve as both a memory cell selector and as a memory element. A memory cell in which the programmable resistance element includes a two-terminal threshold switching selector memory element will be simply denoted as an TSS memory cell 401. The current in the memory cells of the first memory level is shown as flowing upward as indicated by arrow Len, but current can flow in either direction, as is discussed in more detail in the following.

Figure 4B:
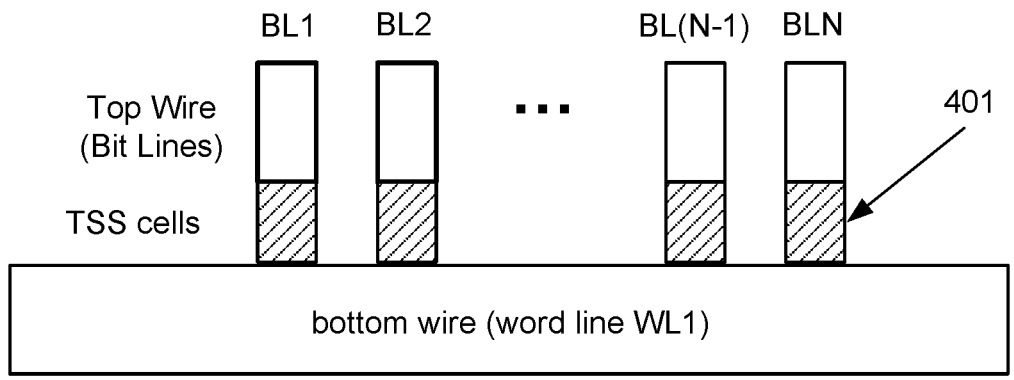
FIGS. 4B and 4C respectively present side and top views of the cross-point structure in FIG. 4A.
Figure 4C:
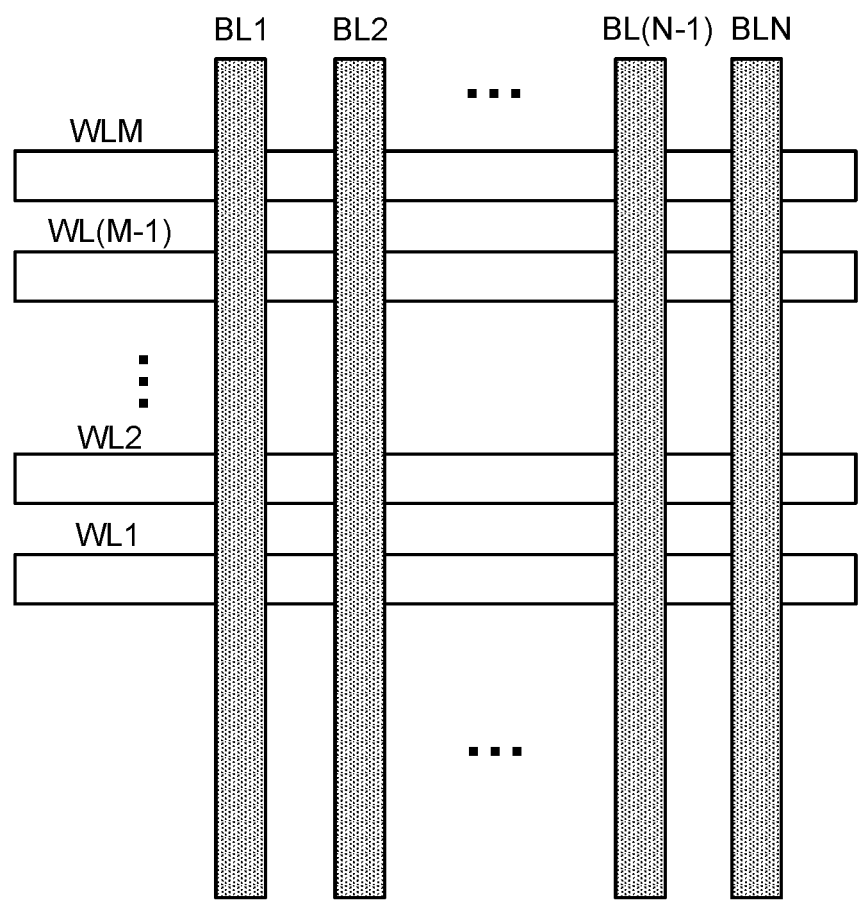

FIGS. 4B and 4C respectively present side and top views of the cross-point structure in FIG. 4A. The sideview of FIG. 4B shows one bottom wire, or word line, $WL_1$ and the top wires, or bit lines, $BL_1$-$BL_n$. At the cross-point between each top wire and bottom wire is a TSS memory cell 401. FIG. 4C is a top view illustrating the cross-point structure for M bottom wires $WL_1$-$WL_M$ and N top wires $BL_1$-$BL_N$. In a binary embodiment, the TSS memory cell at each cross-point can be programmed into one of two read on-state resistance states: HRS and LRS. More detail on embodiments for a TSS memory cell design and techniques for their reading are given below. In some embodiments, sets of these wires are arrayed continuously as a "tile", and such tiles may be paired adjacently in the Word Line (WL) direction and orthogonally in the Bit Line direction to create a module. Such a module may be composed of 2×2 tiles to form a four tile combination wherein the WL drivers between the tiles is "center driven" between the tiles with the WL running continuously over the driver at the approximate center of the line. Similarly, BL drivers may be located between the pair of tiles paired in the BL direction to be center driven, whereby the driver and its area is shared between a pair of tiles.

The cross-point array of FIG. 4A illustrates an embodiment with one layer of word lines and bits lines, with the TSS memory cells sited at the intersection of the two sets of conducting lines. To increase the storage density of a memory die, multiple layers of such memory cells and conductive lines can be formed. A two-layer example is illustrated in FIG. 4D.

Figure 4D:
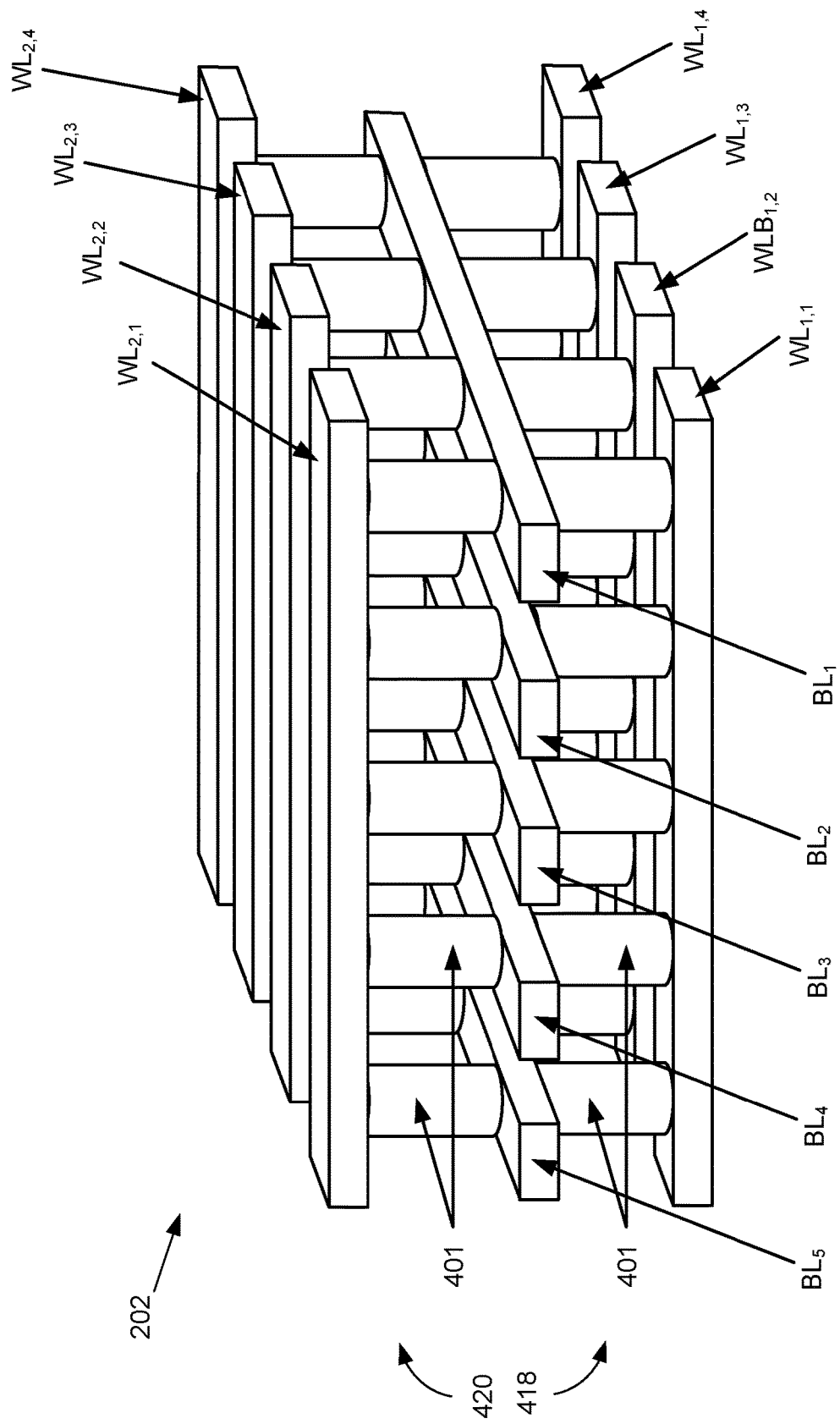
FIG. 4D depicts an embodiment of a portion of a two-level memory array that forms a cross-point architecture in an oblique view.

FIG. 4D depicts an embodiment of a portion of a two-level memory array that forms a cross-point architecture in an oblique view. As in FIG. 4A, FIG. 4D shows a first layer 418 of memory cells 401 of a structure 202 connected at the cross-points of the first layer of word lines $WL_1J$-$WL_{1,4}$ and bit lines $BL_1$-$BL_5$. A second layer of memory cells 420 is formed above the bit lines $BL_1$-$BL_5$ and between these bit lines and a second set of word lines $WL_{2,1}$-$WL_{2,4}$. Although FIG. 4D shows two layers, 418 and 420, of memory cells, the structure can be extended upward through additional alternating layers of word lines and bit lines. Depending on the embodiment, the word lines and bit lines of the array of FIG. 4D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a programmable resistive type of memory cell, where data values are encoded as different on-state resistance levels. The cross-point arrays described here can be used in the memory structures of FIG. 2A or 2B, the local memory 140 in FIG. 3, memory 104 in FIG. 3, and/or the host memory 124 in FIG. 3.

Whether to read or write selected memory cells in the array structures of FIGS. 4A-4D, the bit line and word line corresponding to a selected memory cell are biased to place a voltage across the selected memory cell, or a current through the selected memory cell. Note that herein, a "selected memory cell" means that the memory cell is selected for access (e.g., read access, write access). An "unselected memory cell" means that the memory cell is not selected for access by, for example, placing either its WL or BL or both at a voltage approximately midway between the maximum positive and minimum negative voltages across the memory cell. The terms "unselected memory cell" and "non-selected memory cell" may be used interchangeably. In some embodiments, the programmable resistance element of the memory cell serves as a selector element. In an embodiment, the selector element of a selected memory cell is placed into the conductive state, and the selector element of a non-selected memory cell is placed into the non-conductive state.

Figure 5:
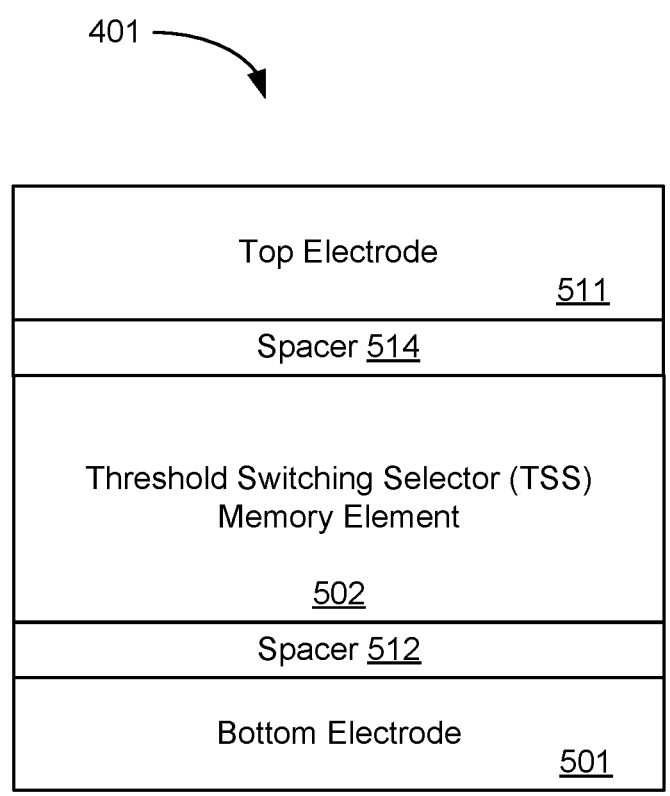
FIG. 5 illustrates an embodiment for the structure of a threshold switching selector memory cell.

FIG. 5 illustrates an embodiment for the structure of a TSS memory cell 401. The TSS memory cell includes a bottom electrode 501, spacer 512, a threshold switching memory selector memory element 502, spacer 514, and then a top electrode 511. In some embodiments, the bottom electrode 501 is connected to a word line and the top electrode 511 is connected to a bit line. In other embodiments, the bottom electrode 501 is connected to a bit line and the top electrode 511 is connected to a word line. The state of the TSS memory cell 401 is based on the resistance of the TSS memory element 502 when the TSS memory element 502 is in the conductive state. The conductive state resistances will be referred to herein as a low resistance state (LRS) and a high resistance state (HRS). Data is written to an TSS memory cell 401 by programming the read on-state of the TSS memory element 502 to either HRS or LRS state.

The TSS memory element 502 has a very high resistance (in an off or non-conductive state) until it is biased to a voltage higher than its threshold voltage, and until its voltage bias falls below Vhold ("Voffset") or current below Ihold. After Vt is exceeded and while Vhold is exceeded across the TSS memory element 502, the TSS memory element 502 has a low resistance (in an on or conductive state). The TSS memory element 502 remains on until its current is lowered below a holding current Ihold, or the voltage is lowered below a holding voltage, Vhold. When this occurs, the TSS memory element 502 returns to the off (non-conductive) state. One set of examples for a TSS memory element 502 is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe6, Si—Te, Zn—Te, C—Te, B—Te, Ge—As—Se—Si, Ge—As—Te—Si, Ge—As—Se—Si—N Ge—As—Te—Si—N, Ge—As—Se—Te—Si, Ge—Se—As—Te, Ge—Se—As—Te—Si, and Ge—Se—As—Te—Si—N, with atomic percentages ranging from a few percent to more than 90 percent for each element. In an embodiment, the TSS memory element 502 is a two-terminal element. The TSS memory cell 401 can also contain additional conducting layers on the interface with the top electrode 511. For example, spacer 514 is depicted between TSS memory element 502 and top electrode 511. The spacer layer 514 can be a single conducting layer or composed of multiple conducting layers. The TSS memory cell 401 can also contain additional conducting layers on the interface with the bottom electrode 501. For example, spacer 512 is depicted between TSS memory element 502 and bottom electrode 501. The spacer layer 512 on the interface with bottom electrode 501 can be a single conducting layer or composed of multiple conducting layers. Examples of conducting layers adjacent to the TSS memory element 502 include carbon, carbon nitride, carbon silicide, carbon tungsten, titanium, titanium nitride, tungsten, tungsten nitride, tantalum, tantalum nitride, and others. In an embodiment, TSS memory element 502 has a Threshold Voltage (Vt) above which the resistance changes substantially from insulating, or quasi insulating, to conducting.

In some embodiments, the material that forms the bottom electrode 501 and/or the top electrode 511 can impact the read margin. The electrode material may have an impact on the difference in resistance between the LRS 12 and the HRS 14. Increasing the resistance between the LRS 12 and the HRS 14 improves read margin. In one embodiment, the bottom electrode 501 and/or the top electrode 511 is formed from TiN, which can improve read margin.

Figure 6A:
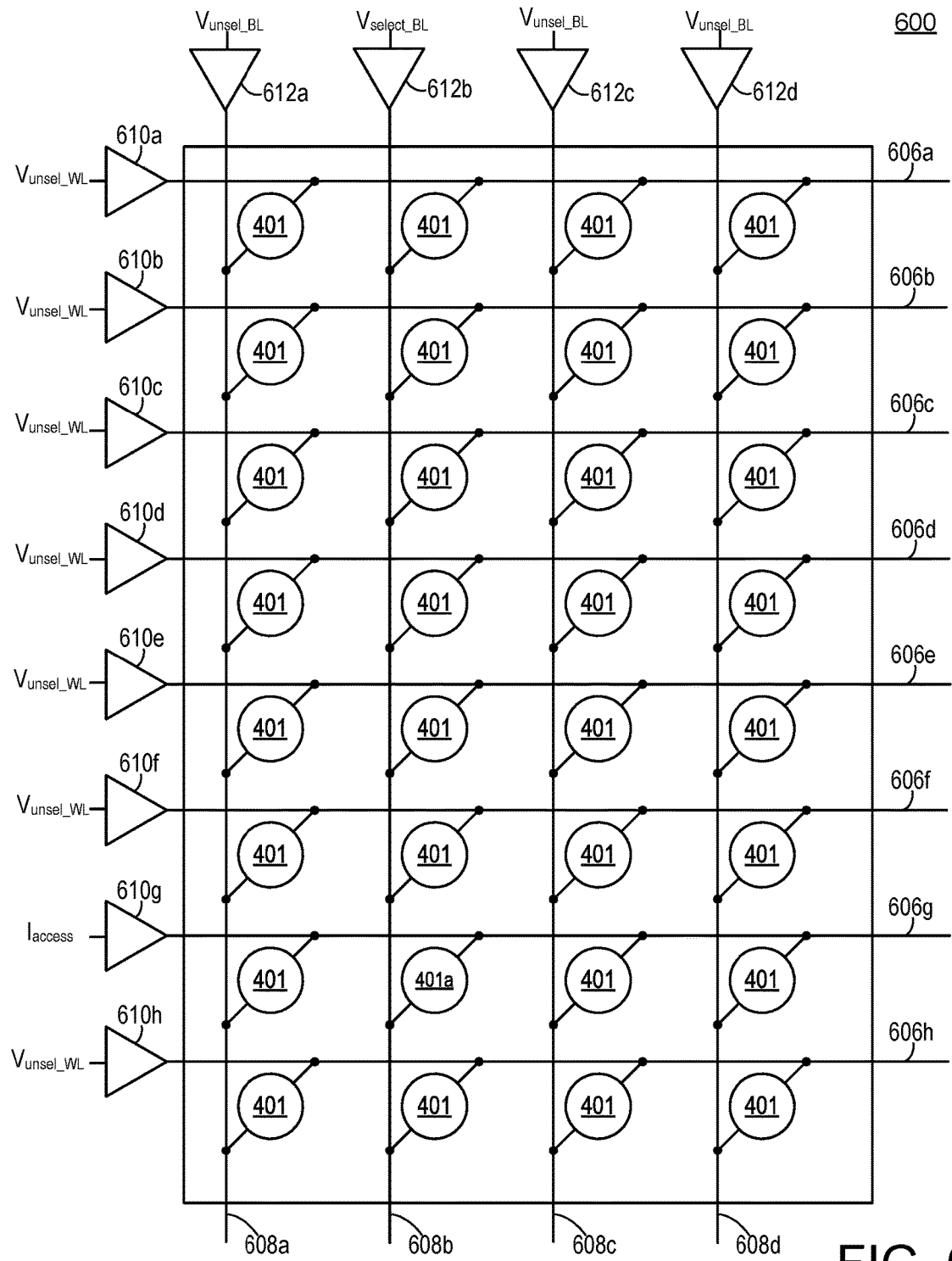
FIG. 6A depicts an embodiment of a memory array having a cross-point architecture in which a current-force approach is used.

FIG. 6A depicts an embodiment of a portion of memory structure 202 having a cross-point architecture. The structure depicted in FIG. 6A may be referred to as a cross-point array or tile 600. Typically, there are many such tiles 600 in the memory structure 202. The tile 600 is depicted as a two-dimensional structure with one layer, but can have multiple layers as in the array in FIG. 4D. Typically, a limited number of memory cells 401 may be accessed in a tile at one time. In some cases, only a single memory cell 401 in the tile is accessed at one point in time. However, typically many tiles may be accessed in parallel. In this manner an ECC codeword may be written or read by accessing different tiles in parallel. In some embodiments, there are many tiles 600 in a bay, with multiple bays in the memory structure 202.

The tile 202 has a set of first conductive lines 606a-606h and a set of second conductive lines 608a-608d. In one embodiment, the set of first conductive lines 606a-606h are word lines and the set of second conductive lines 608a-608b are bit lines. For ease of discussion, the set of first conductive lines 606a-606h may be referred to as word lines and the set of second conductive lines 608a-608b may be referred to as bit lines. However, the set of first conductive lines 606a-606h could be bit lines and the set of second conductive lines 608a-608b could be word lines.

The tile 202 has a number of TSS memory cells 401. Each TSS memory cell 401 is connected between one of the first conductive lines 606 and one of the second conductive lines 608. Each TSS memory cell 401 has a TSS memory element 502 (see FIG. 5). Hence, each memory cell ("bit") 401 may be referred to as a TSS memory cell 401. In an embodiment, the TSS memory element 502 in a memory cell 401 is configured to become conductive in response to application of a voltage level exceeding a threshold voltage of the TSS memory element 502, and remains conductive until the current through the TSS memory element 502 is reduced below the holding current, Ihold, or the voltage across the TSS memory element 502 is reduced below the holding voltage, Vhold, The TSS memory element 502 may be a two-terminal device. In an embodiment, the TSS memory element 502 comprises an OTS.

Each first conductive line 606 may be driven by one of the WL drivers 610a-610h. For example, first conductive line 606a may be driven by WL driver 610a, first conductive line 606b may be driven by WL driver 610b, etc. Each second conductive line 608 is driven by one of the BL drivers 612a-612d. For example, second conductive line 608a is driven by BL driver 612a, second conductive line 608b is driven by BL driver 612b, etc. In one embodiment, the word lines and the bit lines are driven from one end of the word line or bit line. FIG. 6A depicts such an embodiment in which the word lines and the bit lines are driven from one end. In an alternative embodiment, the bit lines and/or the word lines are driven from a midpoint. Driving a word line or bit line from a midpoint reduces the worst case IR drop.

A driver may be connected to the selected word line by decode circuitry that selects the WL 606 to be driven. The driver and decode circuitry may be connected to a "global node". However, locations of WL drivers 610a-610h in FIG. 6A may still indicate the location (e.g., end) of the word line that is driven. The decode circuitry can be configured to eliminate the need for a separate driver 610 for each WL 606 in the array. The decode circuitry may be capable of connecting each selected WL 606g to a distinct current driver, while connecting the unselected WLs to a node that is connected to $V_{unsel\_WL}$. Similarly, the decode circuitry can be configured to connect the unselected BLs to a different node that is connected to $V_{unsel\_BL}$, while connecting each selected BL 608b to a node connected to $V_{unsel\_BL}$.

For purpose of discussion, memory cell 401a is being selected for access. To select the memory cell 401a for access the TSS memory element 502 will be placed into the conductive state. This could be a read or a write access. Selected memory cell 401a is at the cross-point of selected word line 606g and selected bit line 608b. The other memory cells not selected for access (i.e., are unselected memory cells). The TSS memory elements 502 of the unselected memory cells will be in the non-conductive state. All other word lines and all other bit lines are unselected by forcing them to an unselect voltage, such as Vmid, for example 1.65V, at approximately one half the drive compliance voltage, for example 3.3V. To select a memory cell 401, a select voltage ($V_{select\_BL}$) such as near ground is provided to the selected bit line (e.g., bit line 608b) and an access current is driven (or forced) through a selected word line (e.g., word line 606g). The access current may flow between a portion of the selected word line, through the selected memory cell, and through a portion of the selected bit line. An unselect voltage ($V_{unsel\_BL}$) is provided to the unselected bit lines (e.g., bit lines 608a, 608c, 608d). In one embodiment, $V_{select\_BL}$ has a magnitude such that the TSS memory element 502 will turn on, assuming that $I_{access}$ is applied to the selected word line. For example, $V_{select\_BL}$ may be approximately 0V. On the other hand, $V_{unsel\_BL}$ has a magnitude such that the TSS memory element 502 in unselected memory cells will not turn on, for example $V_{select\_BL}$ may be approximately 1.65V if the positive power supply is 3.3V. Word line driver 610g drives an access current ($I_{access}$) through at least a portion of selected word line 606g. This access current may also flow through the selected memory cell 401a and in a portion of selected bit line 608b, assuming that the TSS memory element 502 is in the conductive state.

The WL drivers 610 are able force a current into a selected word line, or to apply a voltage to an unselected word line. Thus, each WL driver 610 may contain both a current driver and a voltage driver. The current driver is configured to either source a current or sink a current. In FIG. 6A, WL driver 610g is forcing a current $I_{access}$ into the selected word line 606g. The other word line drivers are applying a voltage ($V_{unsel\_WL}$) to the unselected word lines that results in those word lines not having any memory cell selected for access.

Thus, $I_{access}$ could flow in either direction through the selected word line (as well as the selected bit line). By convention used herein, when a driver 610 is used as a current source the magnitude of the access current is positive. By convention used herein, when a driver 610 is used as a current sink the magnitude of the access current is negative. Whether a driver 610 sources or sinks a current, herein this will be referred to as forcing or driving the current to or through the selected word line. In one embodiment, no current other than leakage is forced through unselected word lines (e.g., 606a, 606b, 606c, 606d, 606e, 606f, and 606h).

In an embodiment, the selected memory cell 401a is read by forcing a read current from driver 610g into the selected word line 606g, while holding the selected bit line 608b at a select voltage (e.g., 0V). Unselected bit lines and unselected word lines may be at a voltage of about 1.5V. The read current will place the TSS memory element 502 of the selected memory cell 401a into the conductive state. The voltage that appears across the TSS memory element 502 in the selected memory cell 401a may be determined while the TSS memory element 502 is in the conductive state. Typically, the actual voltage that is sensed will include some very small voltages across elements other than the TSS memory element 502 (e.g., top electrode 511, bottom electrode 501, and/or conductive lines connected between the memory cell 401 and a sense circuit). However, the expected voltage drops across such elements may be accounted for such that the actual voltage across the TSS memory element 502 may be accurately determined. The read on-state resistance of the TSS memory element 502 may then be determined based on the magnitude of the sensed voltage and the read current. Further details of reading the TSS memory cells 401 are described below. As an example, the read current may be +15 uA, where the positive value indicates that the read current flows in the direction from the selected word line 606g through the selected memory cell 401a and then through the selected bit line 608b. Note that any IR drop across elements such as top electrode 511, bottom electrode 501, and/or conductive lines connected to the memory cell 401 should be the same regardless of whether the TSS memory element 502 is in the LRS or the HRS. Therefore, the voltage difference between the LRS and FIRS can be accurately determined. In another embodiment, the read current is −15 uA, where the negative value indicates that the read current flows in the direction from the selected bit line 608b through the selected memory cell 401a and then through the selected word line 608g. The phrase "forcing a read current into the selected word line" will be used for either the positive current or the negative current.

In an embodiment, the selected memory cell 401a is written by forcing a write current from driver 610g into the selected word line 606g, while holding the selected bit line 608b at a select voltage (e.g., 0V). Unselected bit lines and unselected word lines may be at a voltage of about 1.5V. The write current will place the TSS memory element 502 of the selected memory cell 401a into the conductive state. In one embodiment, the polarity of the write current determines whether the TSS memory element 502 of the selected memory cell 401g will be programmed to the LRS 12 or the HRS 14. In one embodiment, a positive write current will program the TSS memory element 502 of the selected memory cell 401a into the HRS 14 and a negative write current will program the TSS memory element 502 of the selected memory cell 401a into the LRS 12, assuming the current previously applied was positive. Recall from the discussion of FIG. 1 that the relative polarity of two successive signals (voltage or current) may determine whether the TSS memory element 502 is programmed to the LRS 12 or HRS 14. In one embodiment, the read current is +15 uA, a write current of +30 uA will program the selected memory cell 401a into the HRS 14, and a write current of −30 uA will program TSS memory element 502 into the LRS 12. This example assumes that the write currents are immediately preceded by the read current. However, it is not a requirement that the current that immediately precedes the write current is a read current. Also, other magnitudes of write currents may be used to create the LRS 12 and the HRS 14. Further details of embodiments of various magnitudes and durations of read and write current pulses are described below.

In the example of FIG. 6A there are more word lines than bit lines in the cross-point array. In one embodiment, there are more bit lines than word lines in the cross-point array. In one embodiment, the number of bit lines equals the number of word lines in the cross-point array. In the example of FIG. 6A there are twice as many word lines as bit lines in the cross-point array; however, a different ratio could be used. Thereby, different tile sizes may be realized. For example, a tile 600 may have 1024 BL by 2048 WL, which may be composed into a module of 2048×4096 cells by center driving the WL and BL between the four tiles 600.

Figure 6B:
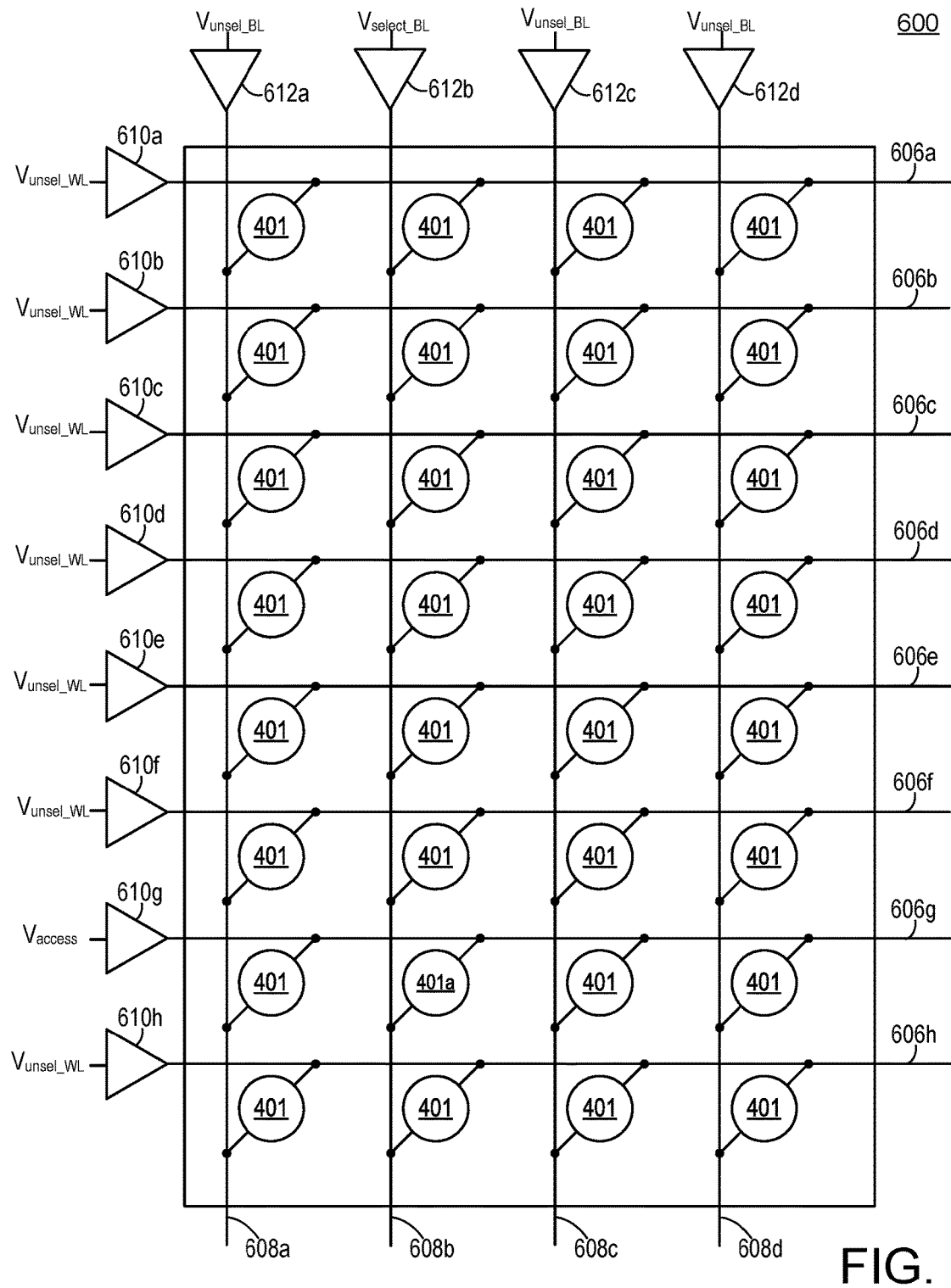
FIG. 6B depicts an embodiment of a memory array having a cross-point architecture in which a voltage-force approach is used.

In some embodiment, the programmable resistance memory cells are read and written using a voltage-force approach. FIG. 6B depicts an embodiment of a portion of memory structure 202 having a cross-point architecture in which a voltage-force approach is used. The architecture is similar to the one in FIG. 6A and will not be discussed in detail. In FIG. 6B, an access voltage $V_{access}$ is driven by WL driver 610g onto word line 606g while the select voltage $V_{select\_BL}$ is driven on bit line 608b to select memory cell 401a.

In an embodiment, the selected memory cell 401a is read by forcing a read voltage from driver 610g onto the selected word line 606g, while holding the selected bit line 608b at a select voltage (e.g., 0V). Unselected bit lines and unselected word lines may be at a voltage of about 1.5V. The read voltage will place the TSS memory element 502 of the selected memory cell 401a into the conductive state. The current that passes through the selected memory cell 401a may be sensed while TSS memory element 502 of the selected memory cell is in the conductive state. The resistance may then be determined based on the magnitude of the memory cell current and the read voltage.

In an embodiment, the selected memory cell 401a is written by forcing a write voltage from driver 610g onto the selected word line 606g, while holding the selected bit line 608b at a select voltage (e.g., 0V). Unselected bit lines and unselected word lines may be at a voltage of about 1.5V. The write voltage will place the TSS memory element 502 of the selected memory cell 401a into the conductive state. In one embodiment, the polarity of the write voltage, relative to the polarity of the previous voltage applied to the memory cell 401, determines whether the memory cell 401g will be programmed to the LRS 12 or the HRS 14. In one embodiment, a positive write voltage will program the selected memory cell 401a into the HRS 14 and a negative write voltage will program the TSS memory element 502 of the selected memory cell 401a into the LRS 12, assuming that the "read voltage" is positive. In one embodiment, a positive voltage (read or write) is defined as one in which the selected word line voltage is greater than the selected bit line voltage.

Figure 7:
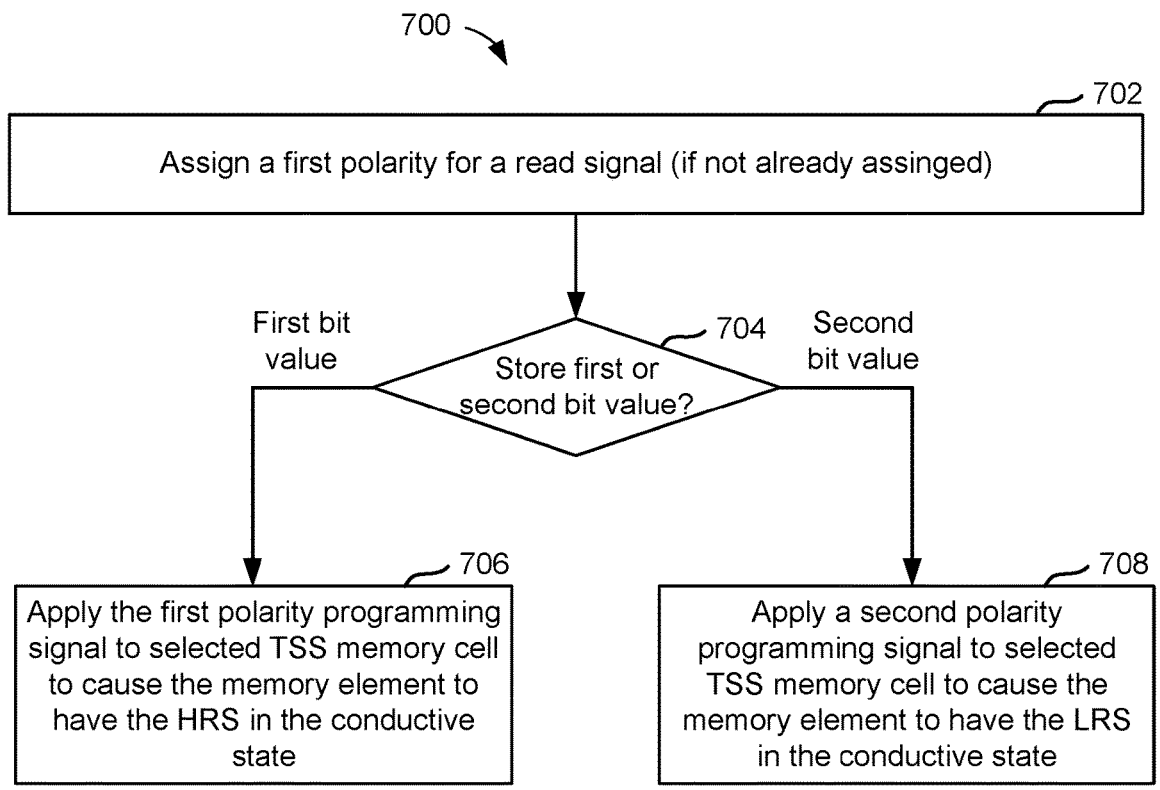
FIG. 7 is a flowchart of one embodiment of a process of programming a two-terminal threshold switching selector memory cell in a cross-point array.

FIG. 7 is a flowchart of one embodiment of a process 700 of programming a TSS memory cell 401 in a cross-point array. The process 700 may be used to program a TSS memory cell 401 such as the one discussed in FIG. 5. In one embodiment, the TSS memory cell 401 includes an OTS that serves as the programmable resistance memory element (i.e., the TSS memory element 502). The process 700 may be performed on many memory cells in parallel, such as performing the process in selected memory cells in different tiles 600. In one embodiment, process 700 is performed by one or more control circuits such as, but not limited to, one or more of memory controller 102, system control logic 260, column control circuitry 210, row control circuitry 220, a micro-controller, a state machine, host processor 122 and/or other control circuitry, or other analogous circuits that are used to control non-volatile memory.

Step 702 includes choosing a first polarity for future read signals applied to the TSS memory cell 401. Step 702 can be omitted if the choice of first polarity has already been established and does not need to be changed. The first polarity can be positive or negative and can be chosen to maximize the conductivity difference between the HRS and LRS.

Step 704 includes a determination of whether to store a first bit value or a second bit value into the TSS memory cell 401. As one example, the first bit value is "0" and the second bit value is "1". As another example, the first bit value is "1" and the second bit value is "0." However, the bit values could be reversed from this example.

If the first bit value is to be stored, then step 706 is performed. Step 706 includes applying a programming (or write) signal having the first polarity to the TSS memory cell 401 to cause the TSS memory element 502 to have the HRS 14 in the conductive state. The HRS 14 represents the first bit value. Thus, the programming signal in step 706 has the same polarity as the read signal if the cell is read in the future.

If the second bit value is to be stored, then step 708 is performed. Step 708 includes applying a programming signal having a second polarity to the TSS memory cell 401 to cause the TSS memory element 502 to have the LRS 12 in the conductive state. The second polarity is opposite to the first polarity. Thus, the programming signal in step 708 has the opposite polarity as a future read signal. The LRS 12 represents the second bit value. In steps 702, 706, and 708 either a current-force or a voltage-force technique may be used to apply the signals.

Figure 8:
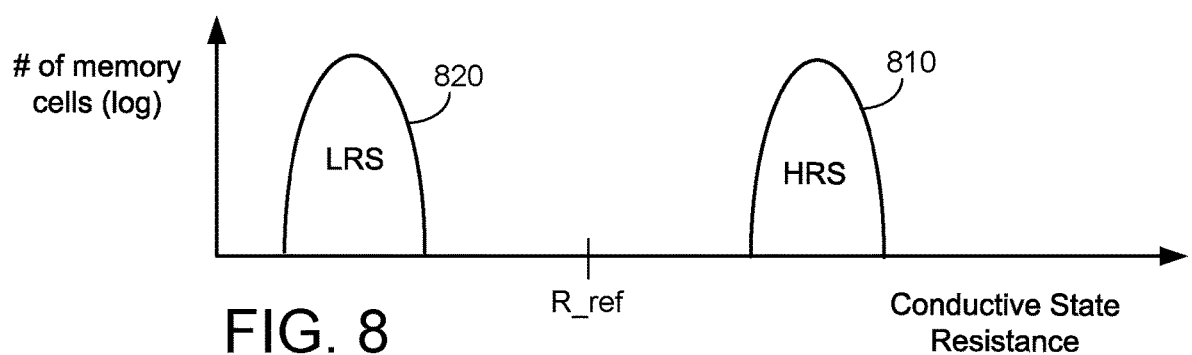
FIG. 8 depicts two "resistance distributions" for the conductive state of an embodiment of a TSS memory cell.

After process 700 is applied to a group of TSS memory cells 401, the TSS memory elements 502 of the memory cells 401 may have resistance distributions as depicted in FIG. 8. FIG. 8 depicts two "resistance distributions" for the conductive state of the TSS memory elements 502 as they would be measured when read with a read signal of the first polarity. The FIRS distribution 810 represents TSS memory elements 502 that store a first bit value. The LRS distribution 820 represents TSS memory elements 502 that store a second bit value. The vertical axis represents the numbers of memory cells having the TSS memory elements 502 in each distribution and is a log scale. The horizontal axis represents the TSS memory element 502 resistance when the TSS memory element 502 is in the conductive state. A reference resistance R_ref is depicted between the two resistance distributions 810, 820. In an embodiment, R_ref is used to distinguish between the two resistance states. For example, if when in the conductive state the resistance of the TSS memory element 502 is less than R_ref, then the memory system determines that the TSS memory element 502 is in the LRS. If when in the conductive state the resistance of the TSS memory element 502 is greater than R_ref, then the memory system determines that the TSS memory element 502 is in the HRS. In practice, a reference voltage or reference current may be used instead of a reference resistance.

Figure 9:
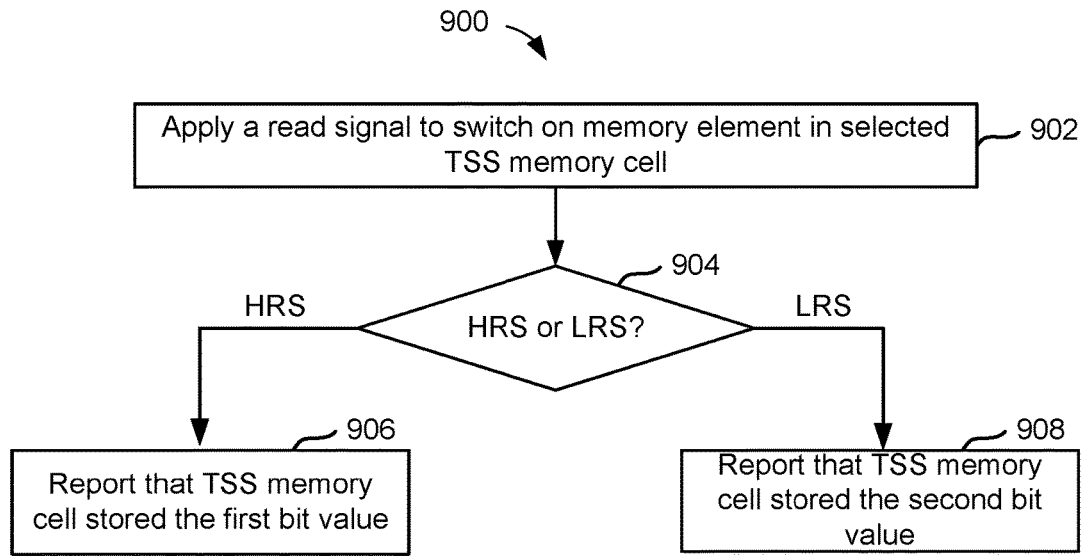
FIG. 9 is a flowchart of one embodiment of a process of reading a threshold switching selector (TSS) memory cell.

FIG. 9 is a flowchart of one embodiment of a process 900 of reading a TSS memory cell 401. The process 900 may be performed after performing process 700 to program the memory cell, but a different process could be used to program the memory cell. Process 900 may use a current-force technique or a voltage-force technique.

Step 902 includes applying a read signal to switch on the TSS memory element 502 in the selected TSS memory cell 401. Thus, the read signal will place the TSS memory element 502 into the read on-state. The read on-state will have either the FIRS 14 or LRS 12, depending on the polarity of the prior programming signal. In one embodiment, the read signal has the same polarity as the write signal that is used to program a memory cell to the FIRS 14.

Step 904 includes a determination of whether the TSS memory element 502 is in the LRS 12 or the HRS 14 while the TSS memory element 502 is in the read on-state. If the TSS memory element 502 is in the HRS, then in step 906 the memory system records or reports that the memory cell 401 stored the first bit value. If the TSS memory element 502 is in the LRS, then in step 908 the memory system records or reports that the memory cell 401 stored the second bit value. The past tense "stored" is used because in some embodiments the read is destructive, which means that the resistance state may be changed by the read. However, the memory system may program the memory cell back to its original resistance state, if needed.

Figure 10:
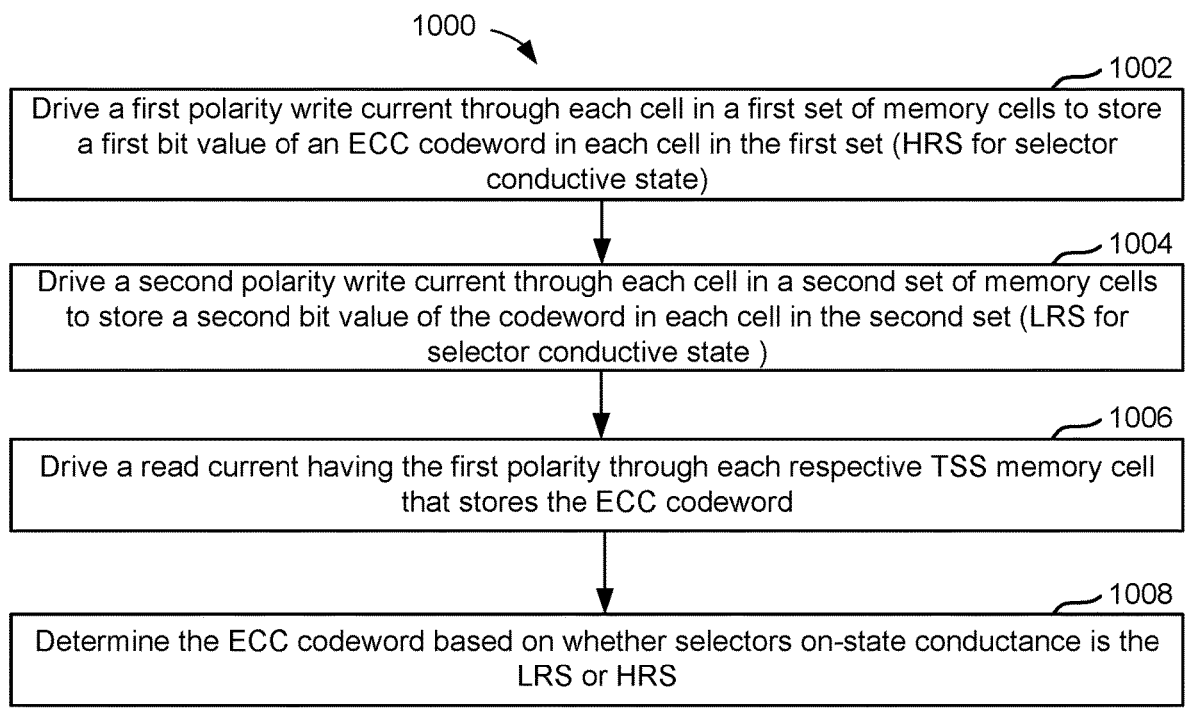
FIG. 10 is a flowchart of one embodiment of a process of programming and reading an ECC codeword from a group of TSS memory cells using a current-force technique.

FIG. 10 is a flowchart of one embodiment of a process 1000 of programming and reading an ECC codeword from a group of TSS memory cells 401. In some embodiments, a current-force technique is used. Selected cells in many different tiles 600 may be involved.

Step 1002 includes driving a current having the first polarity through each memory cell 401 in a first set of TSS memory cells 401 in the group to store a first bit value in each cell in the first set. In an embodiment, step 1002 will cause the conductive state of the TSS memory element 502 in each respective cell 401 to be the HRS 14. Thus, the conductive state of the selector in each respective cell 401 will be in the HRS 14 when a read signal is applied in the first polarity.

Step 1004 includes driving a second polarity current through each memory cell in a second set of two-terminal threshold switching memory cells in the group to store a second bit value in each cell in the second set. In an embodiment, step 1004 will cause the conductive state to have the LRS 12. Thus, the conductive state of the selector in each respective cell 401 will be in the LRS 12 when a read signal is applied in the first polarity. Steps 1002 and 1004 will thus program an ECC codeword into the group formed by the first and second sets of memory cells.

Step 1006 includes driving a read current having the first polarity through each respective memory cell 401 that stores the ECC codeword. In an embodiment, step 1006 will place the TSS memory element 502 in each respective memory cell 401 into the read on-state. When in the read on-state caused by the read current the memory cell will have a conductance that was established by the last programming signal the cell experienced.

Step 1008 includes determining the ECC codeword based on whether the selector (i.e., TSS memory element 502) in each respective memory cell is in the LRS 12 or HRS 14. In some embodiments, step 1008 includes sensing a voltage ("sense voltage") across a respective cell in response to driving the read current through the cell. In one embodiment, the sense voltage is compared to a global reference voltage to determine whether the TSS memory element 502 is in the LRS 12 or HRS 14 in what is referred to herein as a "referenced read." In one embodiment, a self-referenced read (SRR) is used to determine whether a TSS memory element 502 is in the LRS 12 or HRS 14. In general, a SRR has a first read (Read1), a write to a known state (e.g., HRS), and a second read (Read2). The sense voltage from Read2 serves as a "self-reference", which is compared to the sense voltage from Read1.

Figure 11A:
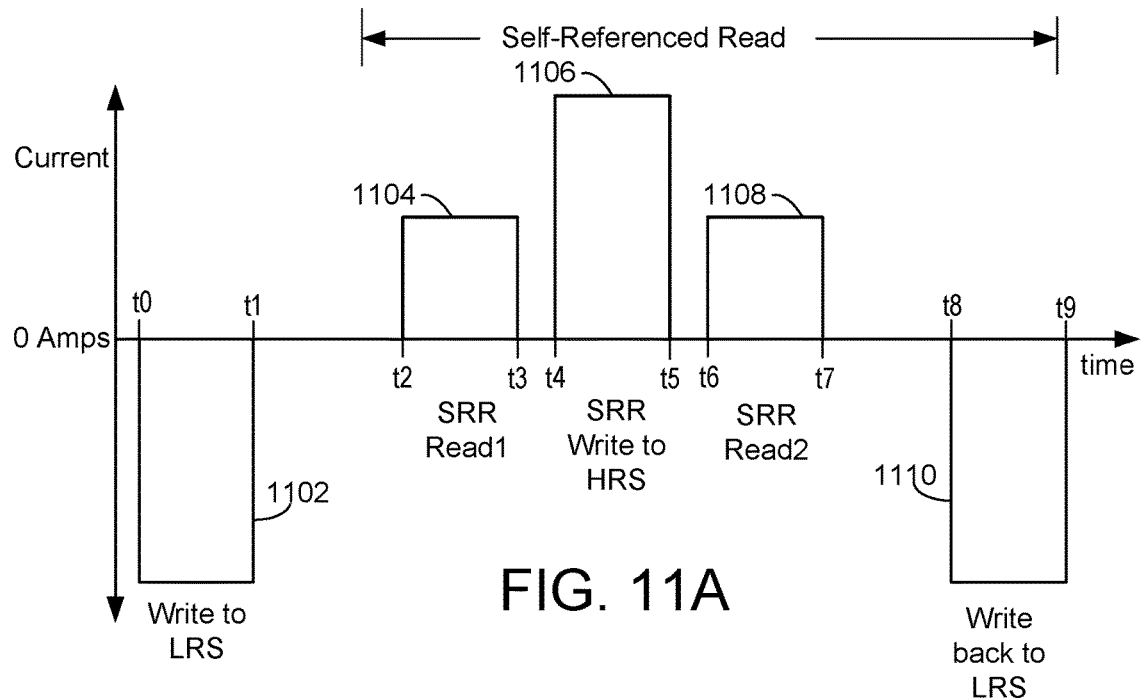
FIG. 11A depict details of one embodiment of waveforms during an SRR of TSS memory cells in which a write-back is performed and the read and write current pulses having different magnitudes.
Figure 11B:
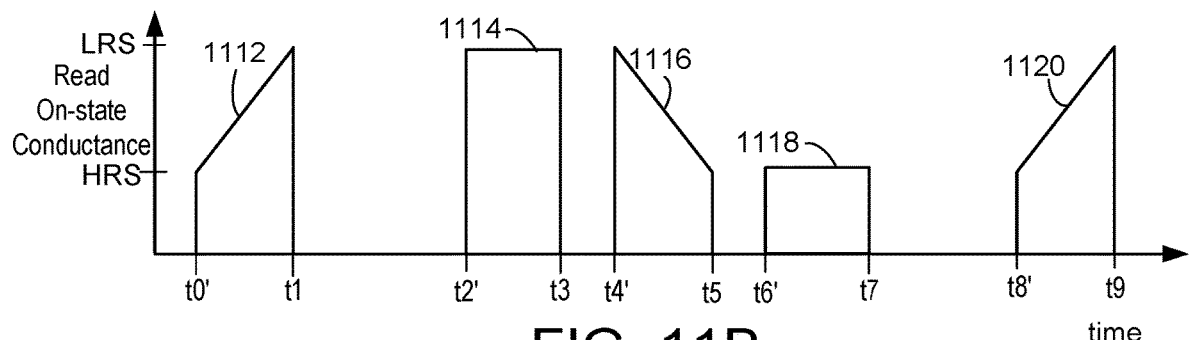
FIG. 11B depicts the read on-state conductance of the memory cell in response to the read and write currents for an SRR consistent with FIG. 11A.
Figure 11C:
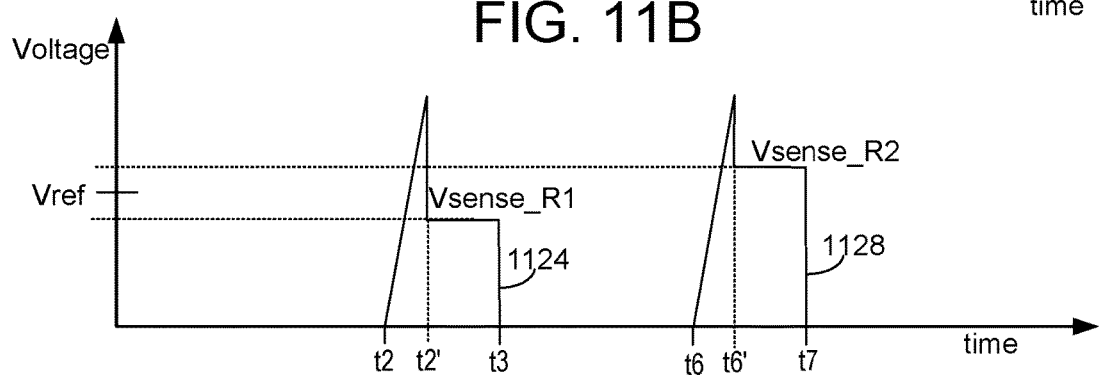
FIG. 11C depicts waveforms for an embodiment of sense voltages for an SRR consistent with FIG. 11A.

FIGS. 11A-11C depict further details of one embodiment an SRR of TSS memory cells 401. FIGS. 11A-11C correspond to a current-force embodiment. FIG. 11A depicts waveforms for an embodiment of read and write current pulses. In an embodiment, the respective current pulses are applied to the selected word line, while the selected bit line is held at a select voltage (e.g., 0V). FIG. 11B depicts the read-on-state conductance of the TSS memory element 502 of the cell 401 in response to the read and write current pulses. As noted above, the on-state conductance may depend on the polarity of the read signal. The read signal in FIG. 11A is by definition positive polarity. Plots 1112, 1116, and 1120 in FIG. 11B represent the impact that the programming pulses applied at that time will have on the read on-state conductance. The actual conductance of the cell during the programming signal can be different than what is depicted in FIG. 11B. Note that the off-state conductance is not depicted in FIG. 11B. FIG. 11C depicts waveforms for an embodiment of sense voltages for Read1 and Read2. Other voltages that a sense amp would detect if enabled outside of Read1 and Read2 are not shown. FIGS. 11A-11C depict an example in which the TSS memory element 502 of the memory cell is programmed to the LRS 12 prior to the SRR.

FIG. 11A shows a write current pulse 1102, which is applied to the TSS memory cell between t0 and t1. In one embodiment, write current pulse 1102 has a magnitude of about −30 uA. The write current pulse 1102 will cause the TSS memory element 502 of the respective memory cells to have the LRS 12 in the conductive state. FIG. 11B shows that the read-on-state conductance 1112 of the TSS memory element 502 increases between t0' and t1 in response to the write current pulse 1102. After applying the write pulse 1102 there may be a small delay for the voltage across the TSS memory element 502 to reach the Vt. Therefore, there may be a small delay for the TSS memory element 502 to reach the conductive state. The TSS memory element 502 switches on at t0'. In an embodiment, the increase in read-on-state conductance depends on the magnitude and/or duration of the write current pulse 1102.

FIG. 11A shows a Read1 current pulse 1104, which is applied to the TSS memory cell between t2 and t3. In one embodiment, the Read1 current pulse 1104 has a magnitude of about +15 uA. FIG. 11B shows that the read-on-state conductance 1114 of the TSS memory element 502 of the memory cell does not change between t2' and t3 in response to the read current pulse 1104. After applying the Read1 current pulse 1104 there may be a small delay for the voltage across the TSS memory element 502 to reach the Vt. Therefore, there may be a small delay for the TSS memory element 502 to reach the conductive state at t2'. In an embodiment, the read current pulses and the write current pulses have about the same duration, but the write current pulses have greater magnitudes in order to change the read on-state conductance of the TSS memory element 502 of the memory cell. Note that there may be a significant time gap between t1 and t2. The memory system may perform read or write operations on other memory cells between t1 and t2. However, the SRR that is performed between t2 and t9 may be performed as an atomic operation.

FIG. 11C depicts a sense voltage 1124 (Vsense_R1) which is the voltage that appears across the memory cell 401 in response to the Read1 current pulse 1104. When the Read1 current pulse 1104 is applied to the selected word line, it may take a short time for the voltage to build up on the selected word line. Therefore, it may take some time for the voltage across the TSS memory element 502 to reach the Vt. FIG. 11C shows the voltage build from t2 to t2' at which point the TSS memory element 502 enters the conductive state. Thus, the TSS memory element 502 will be in the conductive state when Vsense_R1 is measured. In an embodiment, Vsense_R1 is stored on, for example, a capacitor.

FIG. 11A shows a SRR write current pulse 1106, which is applied to the TSS memory cell between t4 and t5. In one embodiment, SRR write current pulse 1106 has a magnitude of about +30 uA. The SRR write current pulse 1106 will cause the TSS memory element 502 of the memory cell to be in the HRS 14 in conductive state. Thus, the TSS memory element 502 is written to the HRS 14. Note that the SRR write current pulse 1106 has the same polarity as the Read1 current pulse 1104. The time t3 and t4 may be identical and the memory element may remain in the on state between Read1 current pulse 1104 and write current pulse 106. In an embodiment, t3 and t4 may be different and the memory element will be in the non-conductive state between t3 and t4. FIG. 11B shows that the read on-state conductance 1116 of the TSS memory element 502 decreases between t4' and t5 in response to the SRR write current pulse 1106. The times t3 and t4 and t4' may be identical. In an embodiment, t3 and t4 are not identical and there is a small gap in time between t4 and t4' for the TSS memory element 502 to switch on and enter the conductive state. In an embodiment, the decrease in read on-state conductance depends on the magnitude and/or duration of the SRR write current pulse 1106. Creating a greater difference between the HRS and the LRS (see read on-state conductance axis of FIG. 11B) helps to improve the read margin. In some embodiments, the magnitude and/or duration of the SRR write current pulse 1106 is sufficiently great (in magnitude) and/or long to maximize the HRS. Stated another way, the SRR write current pulse 1106 removes the excess conductance of the LRS. In an embodiment, the read currents and the write currents have relatively short durations (e.g., 20 ns), but the SRR write current pulse 1106 has a significantly larger magnitude than the read current pulses in order to maximize the HRS for improved read margin.

FIG. 11A shows a Read2 current pulse 1108, which is applied to the TSS memory cell between t6 and t7. In one embodiment, Read2 current pulse 1104 has a magnitude of about +15 uA. FIG. 11B shows that the read on-state conductance 1118 of the TSS memory element 502 of the memory cell does not change between t6' and t7 in response to the Read2 current pulse 1108. If t5 and t6 are not identical, there may be a small time between t6 and t6' when the TSS memory element 502 switches on and enters the conductive state. FIG. 11C depicts a sense voltage 1128 (Vsense_R2) which is the voltage that appears across the memory cell 401 in response to the Read2 current pulse 1108. In one embodiment, there is a time gap between t5 and t6. In one embodiment, there is not a time gap between t5 and t6, such that the TSS memory element 502 does not switch off between the SSR write current pules 1106 and the Read2 current pulse 1108.

The TSS memory element 502 will be in the conductive state when Vsense_R2 is measured. In this example, the TSS memory element 502 was initially written to the LRS by write current pulse 1102 and then written to the HRS by SRR write current pulse 1106. Therefore, there was a change in state. This change in state is reflected by the difference in the magnitude of Vsense_R1 and Vsense_R2. In one embodiment, Vsense_R2 serves as "self-reference" voltage to which Vsense_R1 is compared. In one embodiment, the expected difference between the FIRS and LRS, in combination with the magnitude of the read currents, results in an expected voltage difference between Vsense_R1 and Vsense_R2. The expected difference between Vsense_R1 and Vsense_R2 is referred to as the voltage window. As an example, the voltage window may be about 300 mV. In one embodiment, half of the voltage window is added to Vsense_R1 and then this result is compared to Vsense_R2. In another embodiment, half of the voltage window is subtracted from Vsense_R2 and then this result is compared to Vsense_R1. The voltage Vref on the voltage axis indicates the result of adjusting either Vsense_R1 or Vsense_R2 by half the voltage window. Thus, for example, if after adding half the voltage window to Vsense_R1 if Vsense_R1 is less than Vsense_R2 this indicates that the TSS memory element 502 was in the LRS during Read1. However, if after adding half the voltage window to Vsense_R1 if Vsense_R1 is greater than Vsense_R2 this indicates that the TSS memory element 502 was in the HRS during Read1 (FIG. 12C to be discussed below shows this example).

The SRR is an example of a destructive SRR in that the state the TSS memory element 502 can change as a result of application of SRR write current pulse 1106. Thus, if needed, the TSS memory element 502 is written back to the LRS. FIG. 11A depicts a write-back current pulse 1110, which is applied to the TSS memory cell 401 between t8 and t9. In one embodiment, write-back current pulse 1110 has a magnitude of about −30 uA. The write-back current pulse 1110 will cause the conductive state of the TSS memory element 502 to be written back to the LRS 12. FIG. 11B shows that the read on-state conductance 1120 of the TSS memory element 502 changes between t8' and t9 in response to the write-back current pulse 1110. The time gap between t8 and t8' is the time for the TSS memory element 502 to switch back on. That is, after the Read2 current pulse 1108 is over, the TSS memory element 502 will switch off and be in the non-conductive state. Note that the write current pulse 1102 between t0 and t1 could be the write-back current pulse 1110 from a previous SRR.

Figure 12A:
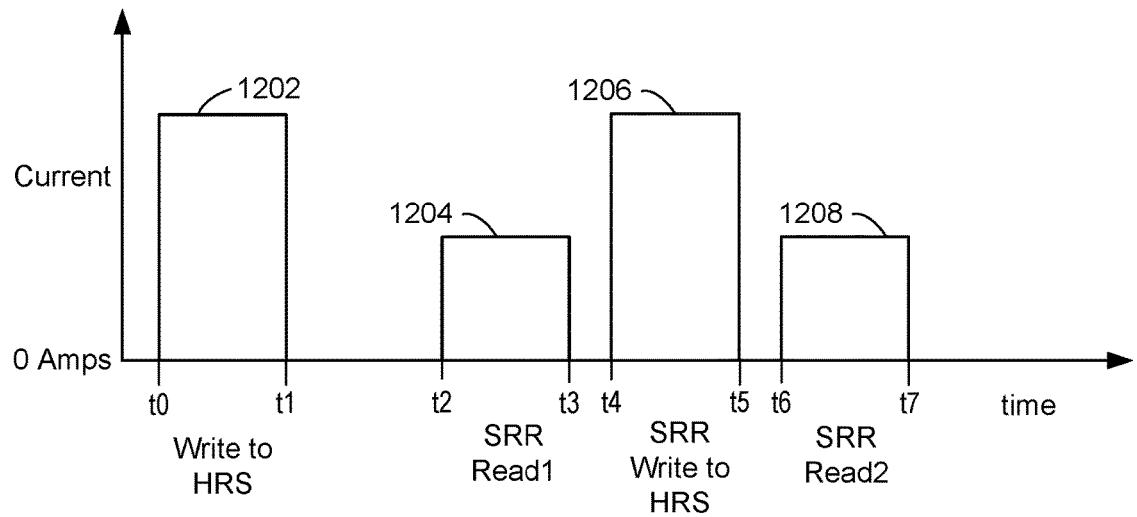
FIG. 12A depict further details of one embodiment of waveforms during a SRR of TSS memory cells in which a write-back is not performed and the read and write current pulses having different magnitudes.
Figure 12B:
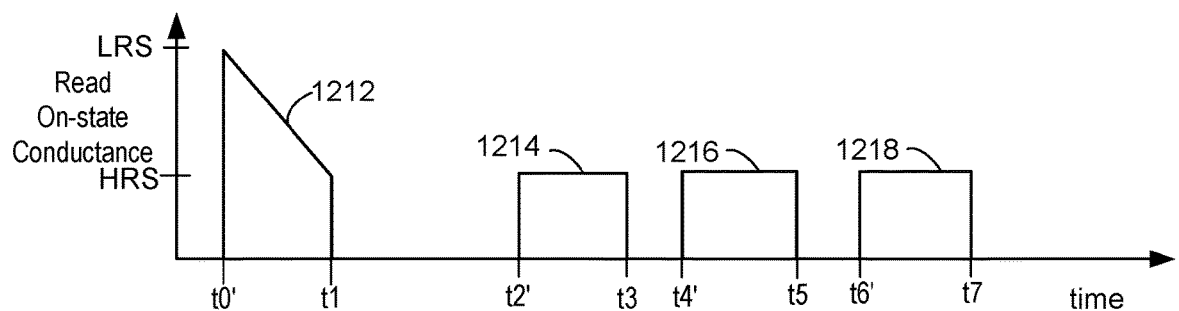
FIG. 12B depicts the read on-state conductance of the memory cell in response to the read and write currents for an SRR consistent with FIG. 12A.
Figure 12C:
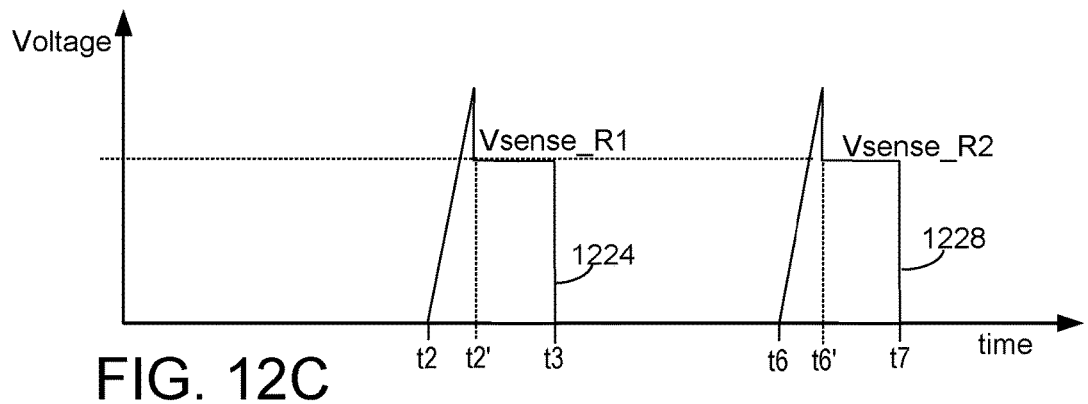
FIG. 12C depicts waveforms for an embodiment of sense voltages for an SRR consistent with FIG. 12A.

FIGS. 12A-12C depict further details of one embodiment of a SRR of TSS memory cells 401, in which the TSS memory element 502 is programmed to the HRS 14 prior to the SRR. FIGS. 12A-12C correspond to a current-force embodiment. FIG. 12A depicts waveforms for an embodiment of the read and write currents. In an embodiment, the various current pulse are applied to the selected word line, while the selected bit line is held at a select voltage (e.g., 0V). FIG. 12B depicts the read on-state conductance of the TSS memory element 502 of the memory cell in response to the read and write currents. FIG. 12C depicts waveforms for an embodiment of sense voltages for Read1 and Read2.

FIG. 12A shows a write current pulse 1202, which is applied to the TSS memory cell between t0 and t1. In one embodiment, write current pulse 1202 has a magnitude of about +30 uA. The write current pulse 1202 will cause the TSS memory element 502 to have the HRS 14 in the conductive state. FIG. 12B shows that the read on-state conductance 1212 of the TSS memory element 502 decreases between t0' and t1 in response to the write current pulse 1202. The TSS memory element 502 switches on at t0'. In an embodiment, the decrease in read on-state conductance depends on the magnitude and/or duration of the write current pulse 1202.

FIG. 12A shows a Read1 current pulse 1204, which is applied to the TSS memory cell between t2 and t3. In one embodiment, Read1 current pulse 1204 has a magnitude of about +15 uA. FIG. 12B shows that the read on-state conductance 1214 of the TSS memory element 502 does not change between t2' and t3 in response to the read current pulse 1204. FIG. 12C depicts a sense voltage 1224 (Vsense_R1) which is the voltage that appears across the memory cell 401 in response to the Read1 current pulse 1204. The TSS memory element 502 switches on at t2'. Therefore, there may be a small delay for the TSS memory element 502 to reach the conductive state at t2'. Thus, the TSS memory element 502 will be in the conductive state when Vsense_R1 is measured. In an embodiment, Vsense_R1 is stored on, for example, a capacitor.

FIG. 12A shows a SRR write current pulse 1206, which is applied to the TSS memory cell between t4 and t5. In one embodiment, SRR write current pulse 1206 has a magnitude of about +30 uA. The SRR write current pulse 1206 will cause the conductive state of the TSS memory element 502 to remain in the HRS 14. Note that the SRR write current pulse 1206 has the same polarity as the Read1 current pulse 1204. If t3 and t4 are not identical then after the Read1 current pulse 1204 the TSS memory element 502 switches off. FIG. 12B shows that the read on-state conductance 1216 of the TSS memory element 502 does not change between t4 and t5 in response to the SRR write current pulse 1206.

FIG. 12A shows a Read2 current pulse 1208, which is applied to the TSS memory cell between t6 and t7. In one embodiment, Read2 current pulse 1204 has a magnitude of about +15 uA. FIG. 12B shows that the read on-state conductance 1218 of the TSS memory element 502 does not change between t6' and t7 in response to the Read2 current pulse 1208. If t5 and t6 are not identical, there may be a small time between t6 and t6' when the TSS memory element 502 switches on and enters the conductive state. In one embodiment, there is a time gap between t5 and t6. In one embodiment, there is not a time gap between t5 and t6, such that the TSS memory element 502 does not switch off between the SSR write current pules 1206 and the Read2 current pulse 1208.

FIG. 12C depicts a sense voltage 1228 (Vsense_R2) which is the voltage that appears across the memory cell 401 in response to the Read2 current pulse 1208. Thus, the TSS memory element 502 will be in the conductive state when Vsense_R2 is measured. As noted above, the SRR write current pulse 1206 did not change the state of the TSS memory element 502. Therefore, the magnitude of Vsense_R1 and Vsense_R2 are about the same. In one embodiment, Vsense_R2 serves as "self-reference" voltage (Vref) to which Vsense_R1 is compared. As discussed above in connection with FIG. 11C, in one embodiment, half of the voltage window is added to Vsense_R1 and then this result is compared to Vsense_R2. If after adding half the voltage window to Vsense_R1 if Vsense_R1 is greater than Vsense_R2 this indicates that the TSS memory element 502 was in the HRS during Read1. In example in FIGS. 12A-12C, there is no need for a write back, as the state of the TSS memory element 502 was not changed by the SRR. Also, note that in some embodiments, the write current pulse 1202 between t0 and t1 could be the SRR write pulse 1206 from a previous SRR, in which case the shape of the read on-state conductance 1212 in FIG. 12B would not go from the LRS at t0 to the HRS at t1, but would resemble the read on-state conductance 1216 between t4 and t5 of the SRR.

In some embodiments, the duration of the read current pulses and the duration the write current pulses are about the same, but the magnitude of the write current pulses is significantly greater than the magnitude of the read current pulses. The waveforms in FIGS. 11A and 12A depict such an embodiment in which the write current pulses have a significantly greater magnitude (in absolute value) than the read current pulses. In the discussion of FIGS. 11A and 12A, an example in which the read current pulses have a magnitude of 15 uA, the write to HRS current pulses have a magnitude of 30 uA, and the write to LRS current pulses have a magnitude of −30 uA was discussed. In some embodiments, the read current pulses have a range between 1 to 20 uA, the write to HRS current pulses have a range between 5 to 100 uA, and the write to LRS current pulses have a range between −5 to −100 uA, with the read current pulses always having a lower magnitude than the absolute value of the write current pulses. In an embodiment, the write current pulses in FIGS. 11A and 12A have the same duration as the read current pulses. Significantly, the greater magnitude (in absolute value) of the SRR write current pulse 1106 in FIG. 11A writes the memory cell from the LRS to the LRS.

Figure 13A:
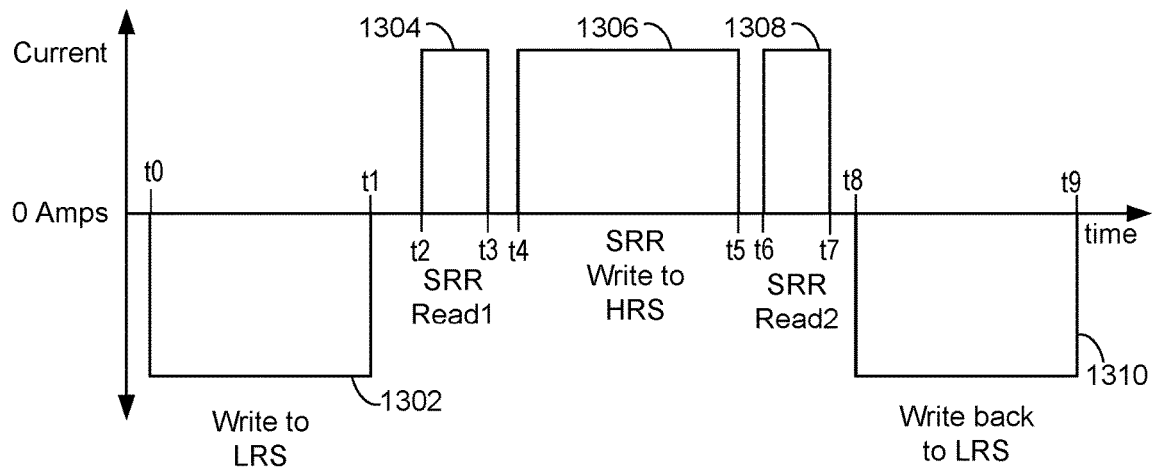
FIG. 13A depict details of one embodiment of waveforms during a SRR of TSS memory cells in which a write-back is performed and the read and write current pulses having different durations.
Figure 13B:
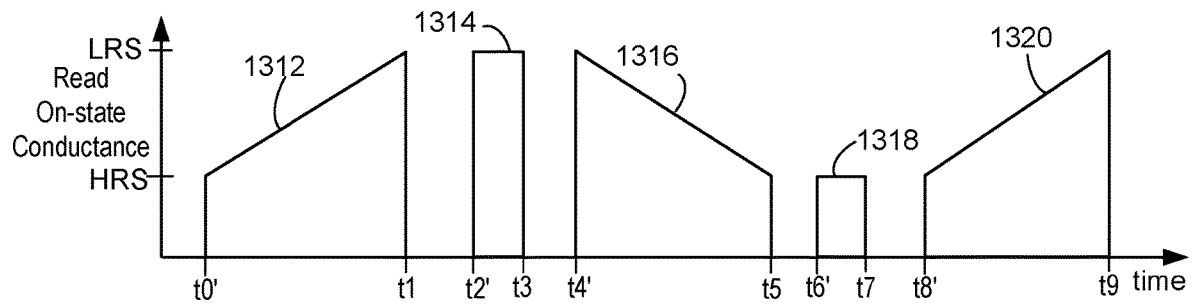
FIG. 13B depicts the read on-state conductance of the memory cell in response to the read and write currents for an SRR consistent with FIG. 13A.
Figure 13C:
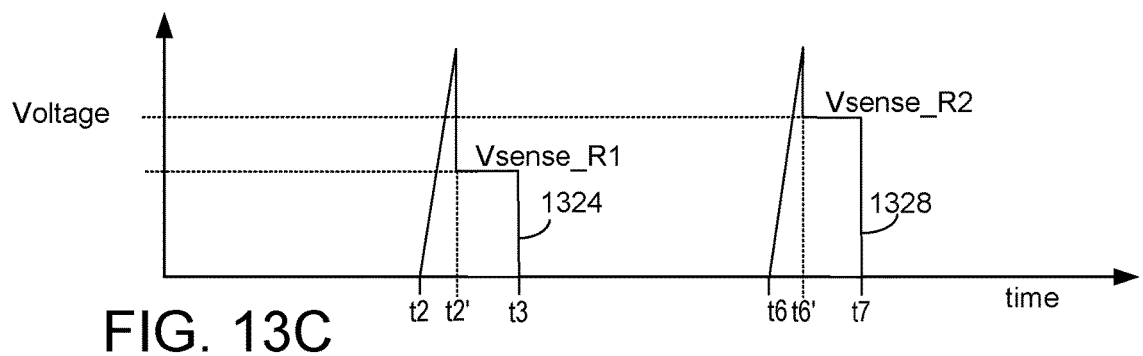
FIG. 13C depicts waveforms for an embodiment of sense voltages for an SRR consistent with FIG. 13A.
Figure 14A:
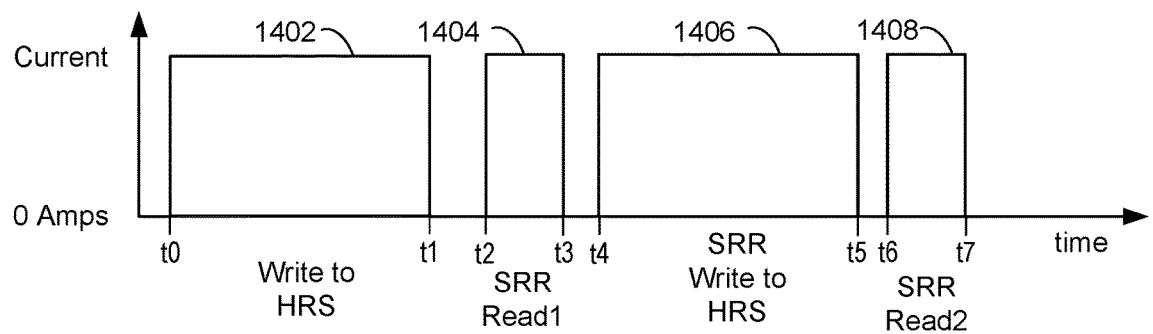
FIG. 14A depicts further details of one embodiment of waveforms during a SRR of TSS memory cells in which a write-back is not performed and the read and write current pulses having different durations.

In some embodiments, the magnitude of the read current pulses and the magnitude the write current pulses are about the same, but the duration of the write current pulses is significantly longer than the duration of the read current pulses. The waveforms in FIGS. 13A and 14A depict such an embodiment in which the write current pulses have a significantly longer duration than the read current pulses. The write current pulses may have the same magnitude (in absolute value) as the read current pulses, but that is not required. FIGS. 13A-13C cover a similar case as was discussed for FIGS. 11A-11C in which the TSS memory element 502 is programmed to the LRS prior to the SRR.

FIG. 13A shows a write current pulse 1302, which is applied to the TSS memory cell between t0 and t1. In one embodiment, write current pulse 1302 has a magnitude of about −15 uA. In one embodiment, write current pulse 1302 has a duration of about 100 ns. The write current pulse 1302 will cause the TSS memory element 502 to have the LRS 12 in the conductive state. FIG. 13B shows the read-on-state conductance 1312 of the TSS memory element 502 increases between t0' and t1 in response to the write current pulse 1302. The TSS memory element 502 switches on at t0'. In one embodiment, write current pulse 1302 is the write back current pulse 1310 from a previous SRR.

FIG. 13A shows a Read1 current pulse 1304, which is applied to the TSS memory cell between t2 and t3. In one embodiment, Read1 current pulse 1304 has a magnitude of about +15 uA. In one embodiment, Read1 current pulse 1304 has a duration of about 20 ns. FIG. 13B shows that the read on-state conductance 1314 of the TSS memory element 502 does not change between t2' and t3 in response to the Read1 current pulse 1304. The TSS memory element 502 switches on at t2'. FIG. 13C depicts a sense voltage 1324 (Vsense_R1) which is the voltage that appears across the memory cell 401 in response to the Read1 current pulse 1304. When the Read1 current pulse 1304 is applied to the selected word line, it may take a short time for the voltage to build up on the selected word line. Therefore, it may take some time for the voltage across the TSS memory element 502 to reach the Vt. FIG. 13C shows the voltage build from t2 to t2' at which point the TSS memory element 502 enters the conductive state. Thus, the TSS memory element 502 will be in the conductive state when Vsense_R1 is measured. In an embodiment, Vsense_R1 is stored on, for example, a capacitor.

FIG. 13A shows a SRR write current pulse 1306, which is applied to the TSS memory cell between t4 and t5. In one embodiment, SRR write current pulse 1306 has a magnitude of about +15 uA. In one embodiment, SRR write current pulse 1306 has a duration of about 100 ns. The SRR write current pulse 1306 will cause the conductive state of the TSS memory element 502 to be the HRS 14. The TSS memory element 502 switches on at t2'. Thus, the memory cell is written to the HRS 14. Note that the SRR write current pulse 1106 has the same polarity as the Read1 current pulse 1304. If t3 and t4 are not identical, the TSS memory element 502 will be in the non-conductive state between t3 and t4. FIG. 13B shows that the read-on-state conductance 1316 of the TSS memory element 502 decreases between t4' and t5 in response to the SRR write current pulse 1306. The reduction of the read-on-state conductance 1316 may be referred to herein as removal of excess conductance associated with the LRS.

FIG. 13A shows a Read2 current pulse 1308, which is applied to the TSS memory cell between t6 and t7. In one embodiment, Read2 current pulse 1308 has a magnitude of about +15 uA. In one embodiment, Read2 current pulse 1308 has a duration of about 20 ns. FIG. 13B shows that the read on-state conductance 1318 of the TSS memory element 502 does not change between t6' and t7 in response to the Read2 current pulse 1308. If t5 and t6 are not identical, there may be a small time between t6 and t6' when the TSS memory element 502 switches on and enters the conductive state. FIG. 13C depicts a sense voltage 1328 (Vsense_R2) which is the voltage that appears across the memory cell 401 in response to the Read2 current pulse 1308. Thus, the TSS memory element 502 will be in the conductive state when Vsense_R2 is measured. In this example, the TSS memory element 502 was initially written to the LRS by write current pulse 1302 and then written to the HRS by SRR write current pulse 1306. Therefore, there was a change in state.

This change in state is reflected by the difference in the magnitude of Vsense_R1 and Vsense_R2. Similar to the example discussed in connection with FIG. 11C, if after adding half the voltage window to Vsense_R1 if Vsense_R1 is less than Vsense_R2 this indicates that the TSS memory element 502 was in the LRS during Read1. In one embodiment, there is a time gap between t5 and t6 such that the TSS memory element 502 turns off after the SRR write pulse 1306. In one embodiment, there is not a time gap between t5 and t6, such that the TSS memory element 502 does not switch off between the SSR write current pules 1106 and the Read2 current pulse 1108. In that case, the TSS memory element 502 will not need to turn back on for the second read.

FIG. 13A depicts a write-back current pulse 1310, which is applied to the TSS memory cell between t8 and t9. In one embodiment, write-back current pulse 1310 has a magnitude of about −15 uA. In one embodiment, write-back current pulse 1310 has a duration of about 100 ns. The write-back current pulse 1110 will cause the conductive state of the TSS memory element 502 to be written back to the LRS 12. FIG. 13B shows that the read on-state conductance 1320 of the TSS memory element 502 changes between t8' and t9 in response to the write-back current pulse 1310. The time gap between t8 and t8' is the time for the TSS memory element 502 to switch back on. That is, after the Read2 current pulse 1308 is over, the TSS memory element 502 will switch off and be in the non-conductive state.

Figure 14B:
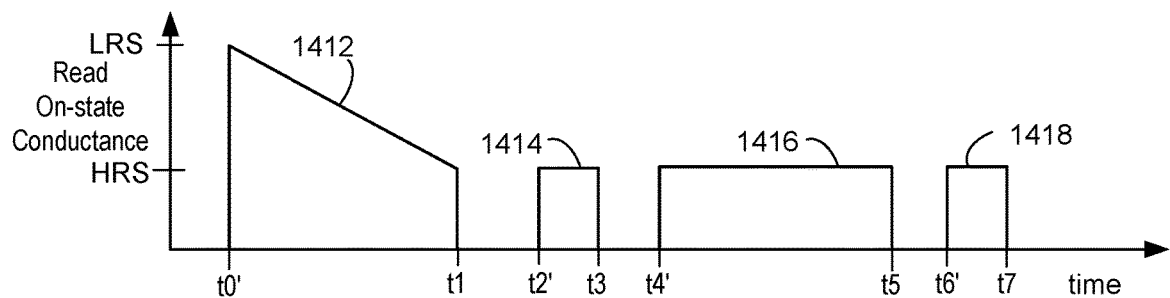
FIG. 14B depicts the read on-state conductance of the memory cell in response to the read and write currents for an SRR consistent with FIG. 14A.
Figure 14C:
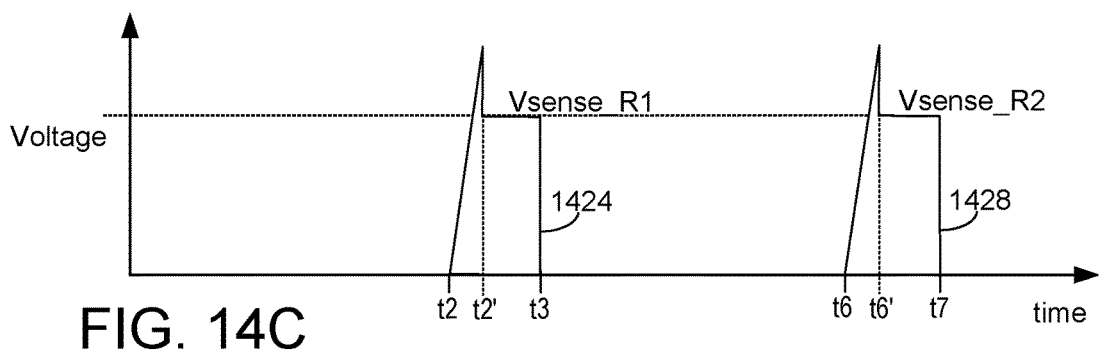
FIG. 14C depicts waveforms for an embodiment of sense voltages for an SRR consistent with FIG. 14A.

FIGS. 14A-14C depict further details of one embodiment of a SRR of TSS memory cells, in which the memory cell is programmed to the HRS 14 prior to the SRR. FIGS. 14A-14C correspond to a current-force embodiment. FIG. 14A depicts waveforms for an embodiment of the read and write currents. In an embodiment, the various current pulse are applied to the selected word line, while the selected bit line is held at a select voltage (e.g., 0V). FIG. 14B depicts the read on-state conductance of the TSS memory element 502 in response to the read and write currents. FIG. 14C depicts waveforms for an embodiment of sense voltages for Read1 and Read2.

FIG. 14A shows a write current pulse 1402, which is applied to the TSS memory cell between t0 and t1. In one embodiment, write current pulse 1402 has a magnitude of about +15 uA. The write current pulse 1402 will cause the conductive state to have the HRS 14. FIG. 14B shows that the read on-state conductance 1412 of the TSS memory element 502 decreases between t0' and t1 in response to the write current pulse 1402. The TSS memory element 502 switches on at t0'.

FIG. 14A shows a Read1 current pulse 1404, which is applied to the TSS memory cell between t2 and t3. In one embodiment, Read1 current pulse 1404 has a magnitude of about +15 uA. FIG. 14B shows that the read on-state conductance 1414 of the TSS memory element 502 does not change between t2' and t3 in response to the read current pulse 1404. FIG. 14C depicts a sense voltage 1424 (Vsense_R1) which is the voltage that appears across the memory cell 401 in response to the Read1 current pulse 1404. The TSS memory element 502 switches on at t2'. Therefore, there may be a small delay for the TSS memory element 502 to reach the conductive state at t2'. Thus, the memory cell will be in the conductive state when Vsense_R1 is measured. In an embodiment, Vsense_R1 is stored on, for example, a capacitor.

FIG. 14A shows a SRR write current pulse 1406, which is applied to the TSS memory cell between t4 and t5. In one embodiment, SRR write current pulse 1406 has a magnitude of about +15 uA. The SRR write current pulse 1406 will cause the conductive state of the TSS memory element 502 to remain in the HRS 14. FIG. 14B shows that the read on-state conductance 1416 of the TSS memory element 502 does not change between t4' and t5 in response to the SRR write current pulse 1406. Note that the SRR write current pulse 1406 has the same polarity as the Read1 current pulse 1404. If t3 and t4 are not identical, the TSS memory element 502 will be in the non-conductive state between t3 and t4.

FIG. 14A shows a Read2 current pulse 1408, which is applied to the TSS memory cell between t6 and t7. In one embodiment, Read2 current pulse 1404 has a magnitude of about +15 uA. FIG. 14B shows that the read on-state conductance 1418 of the TSS memory element 502 does not change between t6' and t7 in response to the Read2 current pulse 1408. There may be a small time between t6 and t6' when the TSS memory element 502 switches on and enters the conductive state. In one embodiment, there is a time gap between t5 and t6. In one embodiment, there is not a time gap between t5 and t6, such that the TSS memory element 502 does not switch off between the SSR write current pules 1406 and the Read2 current pulse 1408.

FIG. 14C depicts a sense voltage 1428 (Vsense_R2) which is the voltage that appears across the memory cell 401 in response to the Read2 current pulse 1408. Thus, the TSS memory element 502 will be in the conductive state when Vsense_R2 is measured. As noted above, the SRR write current pulse 1406 did not change the state of the TSS memory element 502. Therefore, the magnitude of Vsense_R1 and Vsense_R2 are about the same. As discussed above, in one embodiment, half of the voltage window is added to Vsense_R1 and then this result is compared to Vsense_R2. If after adding half the voltage window to Vsense_R1 if Vsense_R1 is greater than Vsense_R2 this indicates that the memory cell was in the HRS during Read1. In example in FIGS. 14A-14C, there is no need for a write back, as the state of the memory cell was not changed by the SRR. Also, note that in some embodiments, the write current pulse 1402 between t0 and t1 could be the SRR write pulse 1406 from a previous SRR, in which case the shape of the read on-state conductance 1412 in FIG. 14B would not go from the LRS at t0 to the HRS at t1, but would resemble the read on-state conductance 1416 between t4 and t5 of the SRR.

Figure 15:
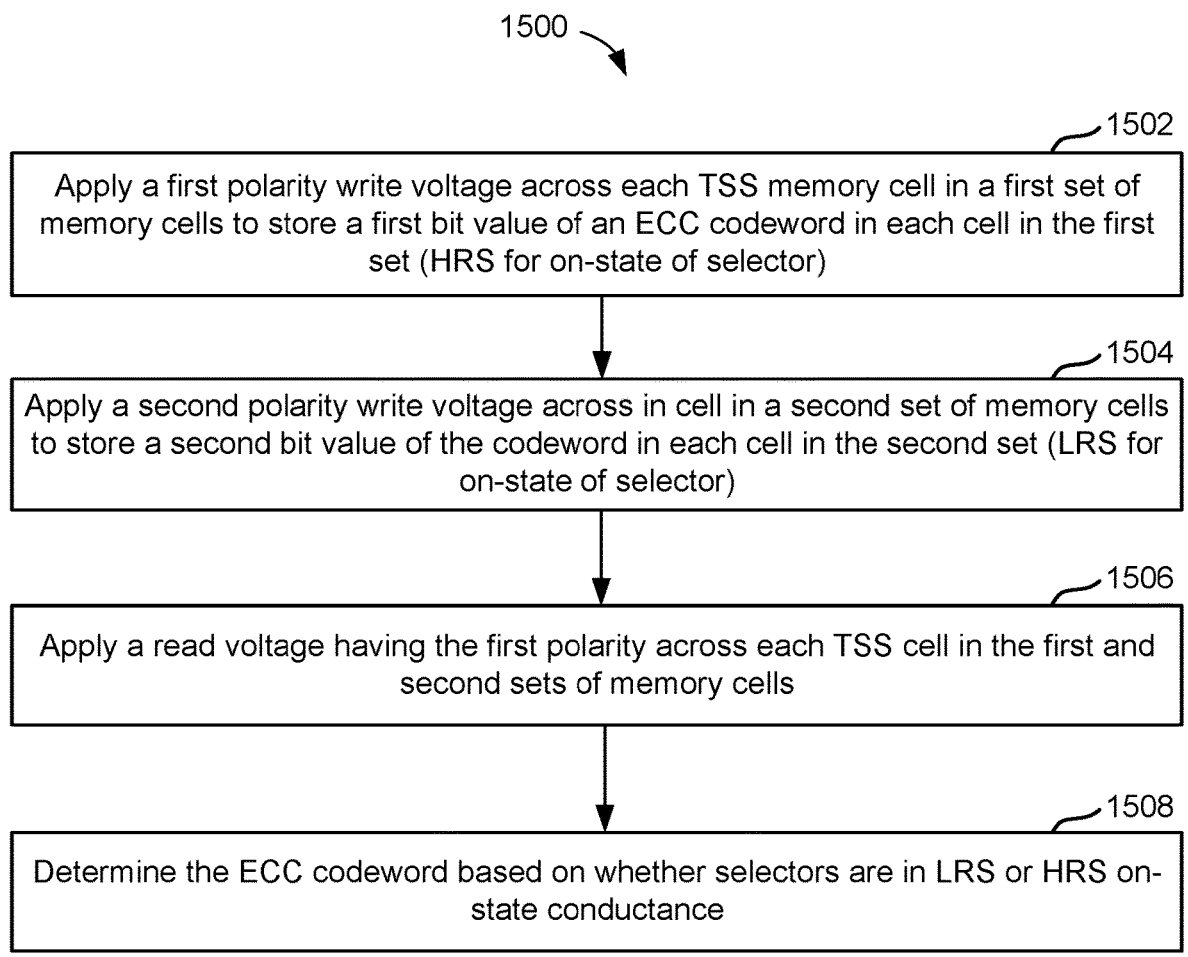
FIG. 15 is a flowchart of one embodiment of a process of programming and reading an ECC codeword from a group of TSS memory cells using a voltage-force technique.

In one embodiment, the TSS memory cells 401 are programmed and read using a voltage-force technique. FIG. 15 is a flowchart of one embodiment of a process 1500 of programming and reading an ECC codeword from a group of TSS memory cells using a voltage-force technique. In some embodiments, selected cells in many different tiles 600 are involved. Prior to process 1500, a voltage having a first polarity is applied to the memory cells.

Step 1502 includes applying the first polarity write voltage across each memory cell in a first set of two-terminal threshold switching memory cells to store a first bit value in each cell in the first set. In an embodiment, step 1502 will cause the conductive state of the selector (i.e., TSS memory element 502) in the memory cell to have the FIRS 14.

Step 1504 includes applying a second polarity write voltage across each memory cell in a second set of TSS memory cells to store a second bit value in each cell in the second set. In an embodiment, step 1504 will cause the conductive state of the selector (i.e., TSS memory element 502) in the respective memory cells to have the LRS 12. Prior to step 1504 a voltage having the first polarity may be applied to the second set of memory cells. Steps 1502 and 1504 will thus program an ECC codeword into the group formed by the first and second sets of memory cells.

Step 1506 includes applying a read voltage having the first polarity across each memory cell that stores the ECC codeword. In an embodiment, step 1506 will place the TSS memory element 502 in each respective memory cell into the read on-state. The read on-state will have a conductance determined by the prior programming signal the element experienced.

Step 1508 includes determining the ECC codeword based on whether the selector (i.e., TSS memory element 502) in each respective memory cell is in the LRS 12 or HRS 14. In some embodiments, step 1508 includes sensing a current ("sense current") that flows through a respective cell in response to applying the read voltage across the cell. In one embodiment, the sense current is converted to a sense voltage by, for example, using the sense current to charge or discharge a capacitor. In an embodiment, the read in steps 1506 and 1508 is part of a referenced read in which the sense voltage is compared to a global reference voltage to determine whether the TSS memory element 502 is in the LRS 12 or HRS 14. In one embodiment, the read in steps 1506 and 1508 is part of a self-referenced read (SRR) used to determine whether a TSS memory element 502 is in the LRS 12 or HRS 14.

In one embodiment of process 1500, the write voltages have the same duration as the read voltage, but have a greater magnitude. In one embodiment of process 1500, the write voltages have the same magnitude as the read voltage, but have a longer duration. In one embodiment of process 1500, the write voltages both a greater magnitude and a longer duration as the read voltage.

In view of the foregoing, it can be seen that, according to a first embodiment, an apparatus, comprising a cross-point array comprising a plurality of first conductive lines, a plurality of second conductive lines, and a plurality of memory cells. Each memory cell is connected between one of the first conductive lines and one of the second conductive lines. Each memory cell has a two-terminal threshold switching memory element having a non-conductive state in which the memory cell is unselected for access and a conductive state in which the memory cell is selected for access. The apparatus has one or more control circuits in communication with the cross-point array. The one or more control circuits are configured to apply a first polarity programming signal to the two-terminal threshold switching memory element of a selected memory cell to cause the memory element to have a high-resistance state (HRS) in the conductive state when read by a read signal having the first polarity. The HRS represents a first bit value. The one or more control circuits are configured to apply a second polarity programming signal to the two-terminal threshold switching memory element of the selected memory cell to cause the memory element to have a low-resistance state (LRS) in the conductive state when read by the read signal having the first polarity. The LRS represents a second bit value. The LRS has a lower resistance than the HRS.

In a second embodiment, in furtherance of the first embodiment, the one or more control circuits are further configured to apply a read signal having the first polarity to the selected memory cell to place the memory element of the selected memory cell in the conductive state after storing the first bit value or the second bit value in the selected memory cell. The one or more control circuits are further configured to determine whether the selected memory cell stores the first bit value or the second bit value based on the resistance of the memory element of the selected memory cell when in the conductive state caused by the read signal.

In a third embodiment, in furtherance of the second embodiment, the read signal has a lower absolute magnitude than a first absolute magnitude of the first polarity programming signal. The read signal has a lower absolute magnitude than a second absolute magnitude of the second polarity programming signal.

In a fourth embodiment, in furtherance of the second embodiment, the read signal has a shorter duration than a first duration of the first polarity programming signal. The read signal has a shorter duration than a second duration of the second polarity programming signal.

In a fifth embodiment, in furtherance of the any of the first to fourth embodiments, the one or more control circuits applying the first polarity programming signal comprises forcing a write current pulse having the first polarity through the selected memory cell to cause the conductive state of the memory element of the selected memory cell to have the HRS if read with the read signal having the first polarity. The one or more control circuits applying the second polarity programming signal comprises forcing a write current pulse having the second polarity through the selected memory cell to cause the conductive state of the memory element of the selected memory cell to have the LRS if read with the read signal having the first polarity.

In a sixth embodiment, in furtherance of the of the any of the first to fourth embodiments, the one or more control circuits applying the first polarity programming signal comprises forcing a write voltage pulse having the first polarity across the selected memory cell to cause the conductive state of the memory element of the selected memory cell to have the HRS if read with the read signal having the first polarity. The one or more control circuits applying the second polarity programming signal comprises forcing a write voltage pulse having the second polarity across the selected memory cell to cause the conductive state of the memory element of the selected memory cell to have the LRS if read with the read signal having the first polarity.

In a seventh embodiment, in furtherance of any of the first to sixth embodiments, the one or more control circuits are further configured to perform a destructive self-referenced read (SRR) to determine whether the selected memory cell stored the first bit value or the second bit value prior to the destructive self-referenced read, including: applying a first read current pulse having the first polarity to the selected memory cell to place the memory element of the selected memory cell in the conductive state; reading a first on-state conductance of the memory element of the selected memory cell in response to the first read current pulse while the memory element of the selected memory cell is in the conductive state; applying a write current pulse having the first polarity to the selected memory cell after the first read current pulse to write the memory element of the selected memory cell to the HRS; applying a second read current pulse having the first polarity to the selected memory cell after writing the memory element of the selected memory cell to the HRS, wherein the memory element of the selected memory cell in is the conductive state while the second read current pulse is applied; reading a second on-state conductance of the memory element of the selected memory cell in response to the second read current pulse while the memory element of the selected memory cell is in the conductive state; and comparing the first on-state conductance with the second on-state conductance to determine the bit value that was stored in the memory cell prior to the destructive self-referenced read In an eighth embodiment, in furtherance of any of the first to seventh embodiments, each two-terminal threshold switching memory cell comprises an Ovonics Threshold Switch (OTS). The conductive state occurs in response to a voltage across the OTS exceeding a threshold voltage of the OTS.

A further embodiment includes a method for reading a programmable resistance memory cell. The method comprises applying a select voltage to a selected bit line in a cross-point array comprising a plurality of bit lines, a plurality of word lines, and a plurality of memory cells, each memory cell connected between one of the bit lines and one of the word lines, each memory cell having a two-terminal threshold switching memory element comprising a threshold switching material. The method comprises forcing a read current having a pre-defined polarity into a selected word line in the cross-point array while the select voltage is applied to the selected bit line to cause a voltage that is greater than a threshold voltage of a two-terminal threshold switching memory element of a selected memory cell connected between the selected word line and the selected bit line to switch the memory element of the selected memory cell from a non-conductive state to a conductive state to select the memory cell. The method comprises sensing a voltage across the memory element of the selected memory cell in response to the read current and while the memory element of the selected memory cell is in the conductive state. The method comprises determining a bit value stored in the selected memory cell based on whether a resistance of the memory element of the selected memory cell in the conductive state indicates a high resistance state (HRS) of the memory element that represents a first bit value or a low resistance state (LRS) of the memory element that represents a second bit value, wherein the LRS has a lower resistance than the HRS.

A further embodiment includes a memory system, comprising a cross-point array comprising a plurality of first conductive lines, a plurality of second conductive lines, and a plurality of Ovonics Threshold Switch (OTS) memory cells. Each OTS memory cell comprises an OTS memory element. Each OTS memory cell is connected between one of the first conductive lines and one of the second conductive line. Each OTS memory element has an on-state in which OTS memory cell is selected and an off-state in which the OTC memory cell is unselected. The memory system has one or more control circuits in communication with the cross-point array. The one or more control circuits apply a select signal to a selected first conductive line in the cross-point array. The one or more control circuits apply a read signal to a selected second conductive line in the cross-point array while the select signal is applied to the selected first conductive line to switch the OTS memory element in a selected memory cell connected between the first conductive line and the second conductive line from the off-state to the on-state, wherein the on-state comprises a read on-state. The one or more control circuits determine a conductance of the OTS memory element in the selected memory cell in response to the read signal while the OTS memory element is in the read on-state. The one or more control circuits determine a bit value stored in the OTS memory element in the selected memory cell based on whether the read on-state conductance of the OTS memory element is above or below a threshold conductance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a cross-point array comprising a plurality of first conductive lines, a plurality of second conductive lines, and a plurality of memory cells, each memory cell connected between one of the first conductive lines and one of the second conductive lines, wherein each memory cell has a two-terminal threshold switching memory element having a non-conductive state in which the memory cell is unselected for access and a conductive state in which the memory cell is selected for access; and
one or more control circuits in communication with the cross-point array, the one or more control circuits configured to:
apply a first polarity programming signal to the two-terminal threshold switching memory element of a selected memory cell to cause the memory element to have a high-resistance state (HRS) in the conductive state when read by a read signal having the first polarity, wherein the HRS represents a first bit value; and
apply a second polarity programming signal to the two-terminal threshold switching memory element of the selected memory cell to cause the memory element to have a low-resistance state (LRS) in the conductive state when read by the read signal having the first polarity, wherein the LRS represents a second bit value, wherein the LRS has a lower resistance than the HRS.

2. The apparatus of claim 1, wherein the one or more control circuits are further configured to:
apply a read signal having the first polarity to the selected memory cell to place the memory element of the selected memory cell in the conductive state after storing the first bit value or the second bit value in the selected memory cell; and determine whether the selected memory cell stores the first bit value or the second bit value based on the resistance of the memory element of the selected memory cell when in the conductive state caused by the read signal.

3. The apparatus of claim 2, wherein:
the read signal has a lower absolute magnitude than a first absolute magnitude of the first polarity programming signal; and
the read signal has a lower absolute magnitude than a second absolute magnitude of the second polarity programming signal.

4. The apparatus of claim 2, wherein:
the read signal has a shorter duration than a first duration of the first polarity programming signal; and
the read signal has a shorter duration than a second duration of the second polarity programming signal.

5. The apparatus of claim 1, wherein:
the one or more control circuits applying the first polarity programming signal comprises forcing a write current pulse having the first polarity through the selected memory cell to cause the conductive state of the memory element of the selected memory cell to have the HRS if read with the read signal having the first polarity; and
the one or more control circuits applying the second polarity programming signal comprises forcing a write current pulse having the second polarity through the selected memory cell to cause the conductive state of the memory element of the selected memory cell to have the LRS if read with the read signal having the first polarity.

6. The apparatus of claim 1, wherein:
the one or more control circuits applying the first polarity programming signal comprises forcing a write voltage pulse having the first polarity across the selected memory cell to cause the conductive state of the memory element of the selected memory cell to have the HRS if read with the read signal having the first polarity; and
the one or more control circuits applying the second polarity programming signal comprises forcing a write voltage pulse having the second polarity across the selected memory cell to cause the conductive state of the memory element of the selected memory cell to have the LRS if read with the read signal having the first polarity.

7. The apparatus of claim 1, wherein the one or more control circuits are further configured to perform a destructive self-referenced read (SRR) to determine whether the selected memory cell stored the first bit value or the second bit value prior to the destructive self-referenced read, including:
applying a first read current pulse having the first polarity to the selected memory cell to place the memory element of the selected memory cell in the conductive state;
reading a first on-state conductance of the memory element of the selected memory cell in response to the first read current pulse while the memory element of the selected memory cell is in the conductive state;
applying a write current pulse having the first polarity to the selected memory cell after the first read current pulse to write the memory element of the selected memory cell to the HRS;
applying a second read current pulse having the first polarity to the selected memory cell after writing the memory element of the selected memory cell to the HRS, wherein the memory element of the selected memory cell in is the conductive state while the second read current pulse is applied;
reading a second on-state conductance of the memory element of the selected memory cell in response to the second read current pulse while the memory element of the selected memory cell is in the conductive state; and
comparing the first on-state conductance with the second on-state conductance to determine the bit value that was stored in the memory cell prior to the destructive self-referenced read.

8. The apparatus of claim 1, wherein each memory element comprises an Ovonics Threshold Switch (OTS), wherein the conductive state occurs in response to a voltage across the OTS exceeding a threshold voltage of the OTS.

9. A memory system comprising:
a cross-point array comprising a plurality of first conductive lines, a plurality of second conductive lines, and a plurality of Ovonics Threshold Switch (OTS) memory cells, each OTS memory cell comprising an OTS memory element comprising a threshold switching material, each OTS memory cell connected between one of the first conductive lines and one of the second conductive lines, each OTS memory element having an on-state in which OTS memory cell is selected and an off-state in which the OTS memory cell is unselected; and
one or more control circuits in communication with the cross-point array, the one or more control circuits:
apply a select signal to a selected first conductive line in the cross-point array;
apply a read signal having a first polarity to a selected second conductive line in the cross-point array while the select signal is applied to the selected first conductive line to switch the OTS memory element in a selected memory cell connected between the first conductive line and the second conductive line from the off-state to the on-state, wherein the on-state comprises a read on-state;
determine a conductance of the OTS memory element in the selected memory cell in response to the read signal while the OTS memory element is in the read on-state, wherein the conductance of the OTS memory element in the selected memory cell depends on a polarity of a programming signal used to program the OTS memory element; and
determine a bit value stored in the OTS memory element in the selected memory cell based on whether the read on-state conductance of the OTS memory element is above or below a threshold conductance.

10. The memory system of claim 9, wherein:
the select signal is a voltage; and
the read signal is a current pulse having the first polarity.

11. The memory system of claim 10, wherein the one or more control circuits:
responsive to a determination to store a first bit value in the selected OTS memory cell, apply a first write current pulse having the first polarity to the selected second conductive line to cause the OTS memory element in the selected memory cell to have a read on-state conductance below the threshold conductance; and
responsive to a determination to store a second bit value in the selected OTS memory cell, apply a second write current pulse having a second polarity that is opposite the first polarity to the selected second conductive line to cause the OTS memory element in the selected memory cell to have a read on-state conductance above the threshold conductance.

12. The memory system of claim 9, wherein:
the select signal is a voltage pulse; and
the read signal is a voltage pulse having the first polarity.

13. The memory system of claim 12, wherein the one or more control circuits are further configured to:
responsive to a determination to store a first bit value in the selected OTS memory cell, apply a first write voltage pulse having the first polarity to the selected second conductive line to cause the OTS memory element in the selected memory cell to have a read on-state conductance below the threshold conductance; and
responsive to a determination to store a second bit value in the selected OTS memory cell, apply a second write voltage pulse having a second polarity to the selected second conductive line to cause the OTS memory element in the selected memory cell to have a read on-state conductance above the threshold conductance.

14. The memory system of claim 9, wherein the OTS memory cells each comprise an electrode connected between the OTS memory element and either the first conductive line or the second conductive line, wherein the electrode comprises titanium nitride (TiN).

15. The memory system of claim 9, wherein the read signal is a first read signal having the first polarity, wherein the one or more control circuits are further configured to:
store an indication of a first read on-state conductance of the OTS memory element in the selected memory cell while the OTS memory element in the selected memory cell is in the read on-state in response to the first read current;
apply a write signal having the first polarity to the selected second conductive line to cause the read on-state conductance of the OTS memory element in the selected memory cell to be below the threshold conductance;
apply a second read signal having the first polarity to the selected OTS memory cell after applying the write signal to the selected OTS memory cell;
read a second read on-state conductance of the OTS memory element in the selected memory cell while the OTS memory element in the selected memory cell is in the read on-state in response to the second read signal; and
compare the first read on-state conductance with the second read on-state conductance to determine the bit value that was stored in the OTS memory element in the selected memory cell prior to applying the write signal to the selected OTS memory cell.

16. A method comprising:
applying a select signal to a selected first conductive line in a cross-point array, the cross-point array comprising a plurality of first conductive lines, a plurality of second conductive lines, and a plurality of Ovonics Threshold Switch (OTS) memory cells, each OTS memory cell comprising an OTS memory element comprising a threshold switching material, each OTS memory cell connected between one of the first conductive lines and one of the second conductive lines, each OTS memory element having an on-state in which OTS memory cell is selected and an off-state in which the OTS memory cell is unselected;
applying a read signal having a first polarity to a selected second conductive line in the cross-point array while the select signal is applied to the selected first conductive line to switch the OTS memory element in a selected memory cell connected between the first conductive line and the second conductive line from the off-state to the on-state, wherein the on-state comprises a read on-state;
determining a conductance of the OTS memory element in the selected memory cell in response to the read signal while the OTS memory element is in the read on-state, wherein the conductance of the OTS memory element in the selected memory cell depends on a polarity of a programming signal used to program the OTS memory element; and
determining a bit value stored in the OTS memory element in the selected memory cell based on whether the read on-state conductance of the OTS memory element is above or below a threshold conductance.

17. The method of claim 16, wherein:
applying the select signal to the selected first conductive line in the cross-point array comprises applying a select voltage to the selected first conductive line; and
applying the read signal having the first polarity to the selected second conductive line in the cross-point array while the select signal is applied to the selected first conductive line comprises applying a current pulse having the first polarity.

18. The method of claim 17, further comprising:
responsive to a determination to store a first bit value in the selected OTS memory cell, applying a first write current pulse having the first polarity to the selected second conductive line to cause the OTS memory element in the selected memory cell to have a read on-state conductance below the threshold conductance; and
responsive to a determination to store a second bit value in the selected OTS memory cell, applying a second write current pulse having a second polarity that is opposite the first polarity to the selected second conductive line to cause the OTS memory element in the selected memory cell to have a read on-state conductance above the threshold conductance.

19. The method of claim 16, wherein:
applying the select signal to the selected first conductive line in the cross-point array comprises applying a voltage pulse to the selected first conductive line; and
applying the read signal having the first polarity to the selected second conductive line in the cross-point array while the select signal is applied to the selected first conductive line comprises applying a voltage pulse having the first polarity.

20. The method of claim 19, further comprising:
responsive to a determination to store a first bit value in the selected OTS memory cell, applying a first write voltage pulse having the first polarity to the selected second conductive line to cause the OTS memory element in the selected memory cell to have a read on-state conductance below the threshold conductance; and
responsive to a determination to store a second bit value in the selected OTS memory cell, applying a second write voltage pulse having a second polarity to the selected second conductive line to cause the OTS memory element in the selected memory cell to have a read on-state conductance above the threshold conductance.

* * * * *